US010224437B2

(12) United States Patent
Kamakura et al.

(10) Patent No.: US 10,224,437 B2
(45) Date of Patent: Mar. 5, 2019

(54) LIGHT DETECTION DEVICE

(71) Applicant: HAMAMATSU PHOTONICS K.K., Hamamatsu-shi, Shizuoka (JP)

(72) Inventors: Shogo Kamakura, Hamamatsu (JP); Ryuta Yamada, Hamamatsu (JP); Kenichi Sato, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/551,099

(22) PCT Filed: Dec. 14, 2015

(86) PCT No.: PCT/JP2015/084916
§ 371 (c)(1),
(2) Date: Aug. 15, 2017

(87) PCT Pub. No.: WO2016/147504
PCT Pub. Date: Sep. 22, 2016

(65) Prior Publication Data
US 2018/0026145 A1    Jan. 25, 2018

(30) Foreign Application Priority Data
Mar. 18, 2015    (JP) .................................. 2015-054623

(51) Int. Cl.
*H01L 31/02*    (2006.01)
*G01J 1/02*    (2006.01)
(Continued)

(52) U.S. Cl.
CPC .......... *H01L 31/02005* (2013.01); *G01J 1/02* (2013.01); *G01J 1/44* (2013.01);
(Continued)

(58) Field of Classification Search
CPC ......... H01L 31/02005; H01L 31/02027; H01L 31/0203; H01L 31/02322; H01L 31/107;
(Continued)

(56) References Cited

U.S. PATENT DOCUMENTS 8,420,433 B2    4/2013 Jackson et al.
2006/0228825 A1    10/2006 Hembree
(Continued)

FOREIGN PATENT DOCUMENTS

DE    112012004383    7/2014
EP    2924728    9/2015
(Continued)

OTHER PUBLICATIONS

International Preliminary Report on Patentability dated Sep. 28, 2017 for PCT/JP2015/084916.

*Primary Examiner* — Sitaramarao S Yechuri
(74) *Attorney, Agent, or Firm* — Drinker Biddle & Reath LLP

(57) ABSTRACT

A semiconductor substrate includes a first region in which a plurality of pixels are disposed and a second region located inside the first region to be surrounded by the first region when viewed from a direction in which a principal surface and a principal surface oppose each other. A through-hole penetrating through the semiconductor substrate is formed in the second region of the semiconductor substrate. An electrode disposed on a side of the principal surface of the semiconductor substrate and electrically connected to the plurality of pixels and an electrode disposed on a side of a principal surface of a mount substrate are connected to each other via a bonding wire inserted through the through-hole.

10 Claims, 24 Drawing Sheets

(51) Int. Cl.
*H01L 31/10* (2006.01)
*H01L 31/107* (2006.01)
*H04N 5/369* (2011.01)
*G01J 1/44* (2006.01)
*H01L 23/00* (2006.01)
*H01L 27/144* (2006.01)
*H01L 31/0203* (2014.01)
*H01L 31/0232* (2014.01)

(52) U.S. Cl.
CPC .............. *H01L 24/32* (2013.01); *H01L 24/48* (2013.01); *H01L 24/73* (2013.01); *H01L 27/1446* (2013.01); *H01L 31/0203* (2013.01); *H01L 31/02027* (2013.01); *H01L 31/02322* (2013.01); *H01L 31/10* (2013.01); *H01L 31/107* (2013.01); *H04N 5/369* (2013.01); *G01J 2001/448* (2013.01); *G01J 2001/4466* (2013.01); *H01L 2224/05554* (2013.01); *H01L 2224/32227* (2013.01); *H01L 2224/48091* (2013.01); *H01L 2224/48227* (2013.01); *H01L 2224/73265* (2013.01); *H01L 2924/10155* (2013.01); *H01L 2924/12043* (2013.01); *H01L 2924/30105* (2013.01)

(58) Field of Classification Search
CPC ......... H01L 24/32; H01L 24/48; H01L 24/73; H01L 27/1446; H01L 2224/32227; H01L 2224/48227; H01L 2224/73265; H01L 2924/12043; H01L 2924/30105; G01J 1/02; G01J 1/44; G01J 2001/4466; G01J 2001/448
See application file for complete search history.

(56) References Cited

U.S. PATENT DOCUMENTS

| | | | |
|---|---|---|---|
| 2009/0141827 A1* | 6/2009 | Saito | G11C 29/025 375/295 |
| 2010/0295144 A1* | 11/2010 | Jackson | H01L 27/14634 257/443 |
| 2011/0108959 A1* | 5/2011 | Hembree | H05K 3/4046 257/621 |
| 2012/0267746 A1* | 10/2012 | Sanfilippo | H01L 27/1446 257/438 |
| 2014/0327100 A1* | 11/2014 | Nagano | H01L 27/1446 257/438 |

FOREIGN PATENT DOCUMENTS

| | | |
|---|---|---|
| JP | 2006-253330 A | 9/2006 |
| JP | 2008-536311 A | 9/2008 |
| JP | 2010-535409 A | 11/2010 |
| WO | WO-2006/110266 A2 | 10/2006 |
| WO | WO-2009/016407 A2 | 2/2009 |
| WO | WO-2006/110266 A2 | 4/2013 |

* cited by examiner

LIGHT DETECTION DEVICE

TECHNICAL FIELD

The present invention relates to a photodetecting device.

BACKGROUND ART

Known photodetecting devices include a semiconductor photodetecting element including a semiconductor substrate on which a photodiode array including a plurality of pixels is formed and a mount substrate disposed to oppose the semiconductor photodetecting element (for example, refers to Patent Literature 1).

CITATION LIST

Patent Literature

Patent Literature 1: U.S. Pat. No. 8,420,433

SUMMARY OF INVENTION

Technical Problem

In the photodetecting device described in Patent Literature 1, a notch is formed at a corner of the semiconductor substrate. A wire connecting a first electrode disposed on the semiconductor substrate and a second electrode disposed on the mount substrate is disposed at a position of the notch. The first electrode disposed on the semiconductor substrate is disposed adjacent to the notch. Therefore, a wiring distance to the first electrode greatly differs between a pixel located adjacent to the first electrode and a pixel located away from the first electrode (for example, a pixel located adjacent to a corner located to be diagonal to the corner where the notch is formed).

A wiring resistance differs between the pixel located adjacent to the first electrode and the pixel located away from the first electrode. The longer the wiring distance from the pixel to the first electrode is, the larger the wiring resistance is. A stray capacitance generated by a wiring between the first electrode and the pixel also differs between the pixel located adjacent to the first electrode and the pixel located away from the first electrode. The longer the wiring distance from the pixel to the first electrode is, the larger the stray capacitance is. If the wiring resistance and the stray capacitance differ between the pixels, the time (signal arrival time) when the signal reaches the first electrode from the pixel differs between the pixels. The larger a difference between the wiring resistance and the stray capacitance is between the pixels, the larger a difference in signal arrival time is between the pixels.

An object of one aspect of the present invention is to provide a photodetecting device capable of suppressing a difference in signal arrival time between pixels to be small.

Solution to Problem

A photodetecting device according to one aspect of the present invention includes a semiconductor photodetecting element including a semiconductor substrate in which a photodiode array including a plurality of pixels is formed, and a mount substrate disposed to oppose the semiconductor photodetecting element. The semiconductor substrate has a first principal surface and a second principal surface that oppose each other. The mount substrate has a third principal surface that opposes the second principal surface of the semiconductor substrate and a fourth principal surface that opposes the third principal surface. The semiconductor substrate includes a first region and a second region. A plurality of pixels are disposed in the first region. The second region is located inside the first region to be surrounded by the first region when viewed from a direction in which the first principal surface and the second principal surface oppose each other. A through-hole penetrating through the semiconductor substrate is formed in the second region of the semiconductor substrate. A first electrode, disposed on a side of the first principal surface of the semiconductor substrate and electrically connected to the plurality of pixels, and a second electrode, disposed on a side of the third principal surface of the mount substrate, are connected to each other via a first wire that is inserted through the through-hole.

In the photodetecting device according to the one aspect, the through-hole is formed in the second region. A first wire connecting the first electrode and the second electrode is inserted through the through-hole. Therefore, a signal of the photodiode array is taken out from the first principal surface side of the semiconductor substrate and sent to the third principal surface side of the mount substrate. The through-hole through which the first wire is inserted is formed in the second region of the semiconductor substrate. Therefore, the difference in wiring distance between the pixels is small in the photodetecting device according to the one aspect, as compared with a photodetecting device in which the wire is disposed at the position of the notch formed at the corner of the semiconductor substrate. Consequently, the difference in signal arrival time between pixels is suppressed to be small in the photodetecting device according to the one aspect.

In the photodetecting device according to the one aspect, the semiconductor photodetecting element may include a plurality of semiconductor photodetecting elements. In which case, each of the semiconductor photodetecting elements is disposed on the mount substrate in such a manner that the second principal surface and the third principal surface oppose each other. The first electrode and the second electrode are connected to each other via the first wire for each of the semiconductor photodetecting elements. Since the photodetecting device includes the plurality of semiconductor photodetecting elements, the area of a light receiving region of the photodetecting device is increased. As described above, the difference in signal arrival time between pixels is suppressed to be small in each of the semiconductor photodetecting elements.

The semiconductor photodetecting element may include a plurality of channels, and the single channel may be constituted by the single photodiode array. In which case, the first electrode and the second electrode are connected to each other via the first wire for each channel. Since the semiconductor photodetecting element includes the plurality of channels, the area of the light receiving region of the semiconductor photodetecting element (photodetecting device) is increased. As described above, the difference in signal arrival time between pixels is suppressed to be small in each of the channels.

A third electrode, disposed on the side of first principal surface of the semiconductor substrate and electrically connected to the semiconductor substrate, and a fourth electrode, disposed on the side of third principal surface of the mount substrate, may be connected to each other via a second wire that is inserted through the through-hole. In which case, it is possible to appropriately apply a predetermined potential (for example, a cathode potential) to the semiconductor substrate through the second wire and the third electrode. Therefore, it is unnecessary for an electrode, configured to apply the predetermined potential to the semiconductor substrate, to be disposed on the second principal surface side of the semiconductor substrate, and it is possible to reduce manufacturing cost of the semiconductor photodetecting element. Since the second wire is inserted through the through-hole through which the first wire is inserted, there is no need to newly form a through-hole through which the second wire is inserted. Consequently, it is possible to further reduce the manufacturing cost of the semiconductor photodetecting element.

The second region may be located substantially at a center of the first region when viewed from the direction in which the first principal surface and the second principal surface oppose each other. In which case, it is possible to further reduce the difference in signal arrival time between the pixels.

An opening of the through-hole may have a circular shape. A capillary of a wire bonder used to connect the wire is inserted through the through-hole. A diameter of the through-hole depends on an outer diameter of the capillary. When the opening of the through-hole has the circular shape, an area for formation of the through-hole is small, as compared with when the opening of the through-hole has another shape. Therefore, it is possible to suppress a decrease of an aperture ratio in the semiconductor photodetecting element.

An opening of the through-hole may have a rectangular shape. In which case, each distance from an edge of the through-hole to each pixel located around the through-hole is equal. Therefore, it is possible to suppress occurrence of a characteristic variation among pixels.

The photodiode array may include a plurality of avalanche photodiodes that operate in the Geiger mode and are formed in the semiconductor substrate, quenching resistors that are connected in series to the respective avalanche photodiodes and disposed on the side of first principal surface of the semiconductor substrate, and a signal line to which the quenching resistor is connected in parallel and that is disposed on the side of first principal surface of the semiconductor substrate. In which case, the signal line is connected to the first electrode. In the photodiode array, when the avalanche photodiode constituting the pixel detects a photon and performs Geiger discharge, a pulsed signal is obtained by function of the quenching resistor connected to the avalanche photodiode. Each of the avalanche photodiodes counts the respective photons. Therefore, even when a plurality of photons are incident at the same timing, the number of incident photons is determined according to an output charge amount or a signal intensity of the total output pulse. Since the difference in signal arrival time between the avalanche photodiodes is suppressed to be small, deterioration of temporal resolution can be suppressed.

Advantageous Effects of Invention

According to the one aspect of the present invention, it is possible to provide a photodetecting device capable of suppressing a difference in signal arrival time between pixels to be small.

DESCRIPTION OF EMBODIMENTS

Figure 1:
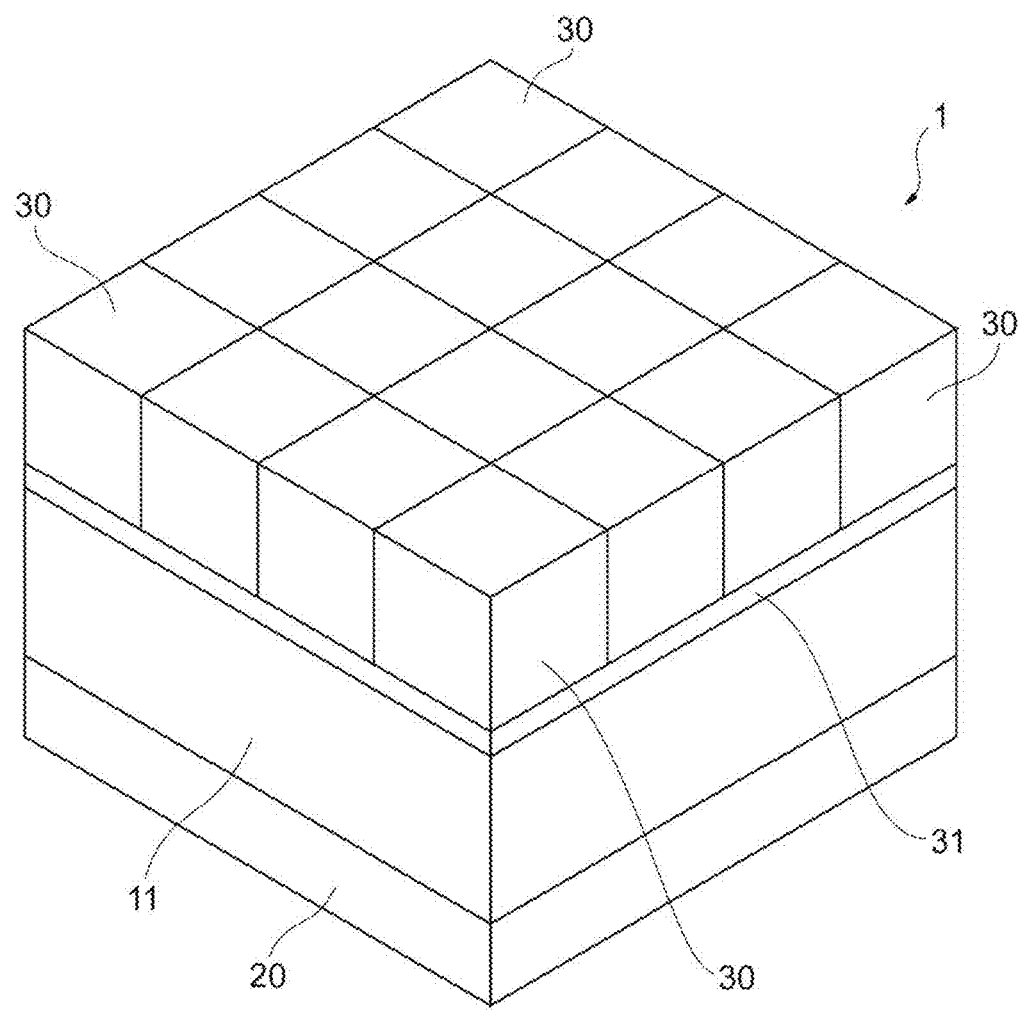
FIG. 1 is a schematic perspective view illustrating a photodetecting device according to an embodiment.

Hereinafter, embodiments of the present invention will be described in detail with reference to the accompanying drawings. Incidentally, the same reference numerals will be used for the same elements or elements having the same functions the description, and redundant description will be omitted.

Figure 2:
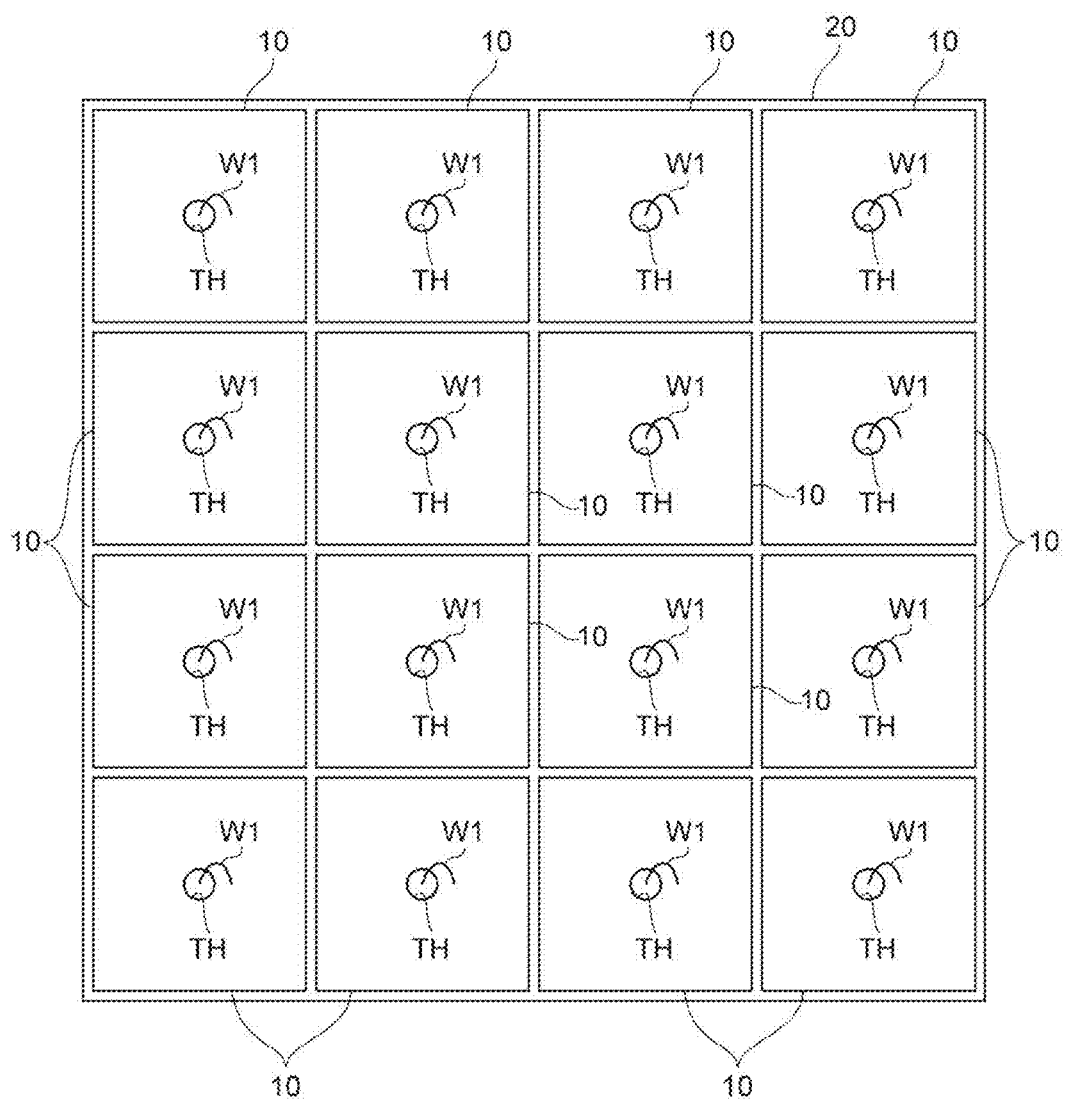
FIG. 2 is a diagram for describing arrangement of a semiconductor photodetecting element.
Figure 3:
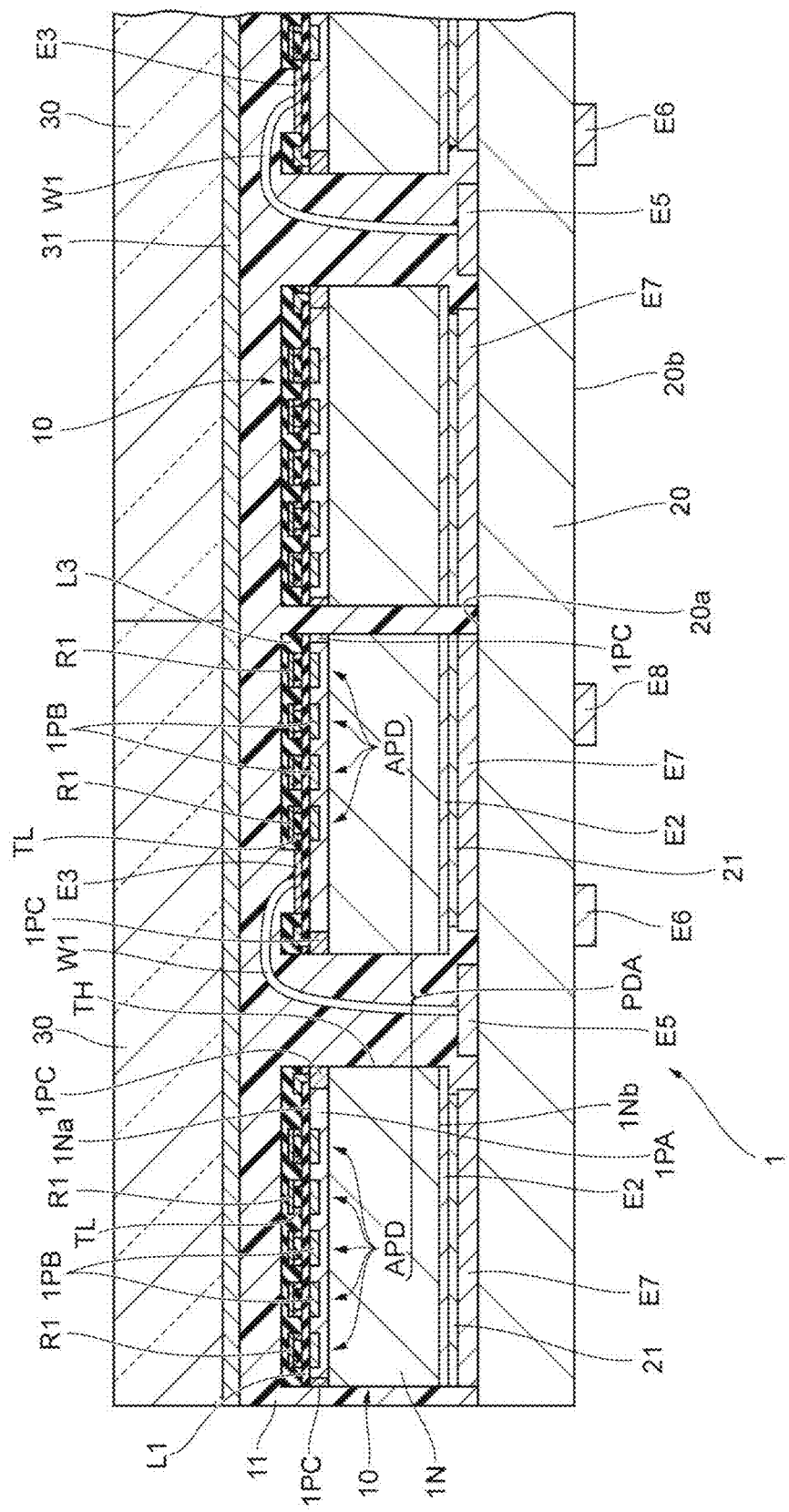
FIG. 3 is a diagram for describing a cross-sectional configuration of the photodetecting device according to the present embodiment.
Figure 4:
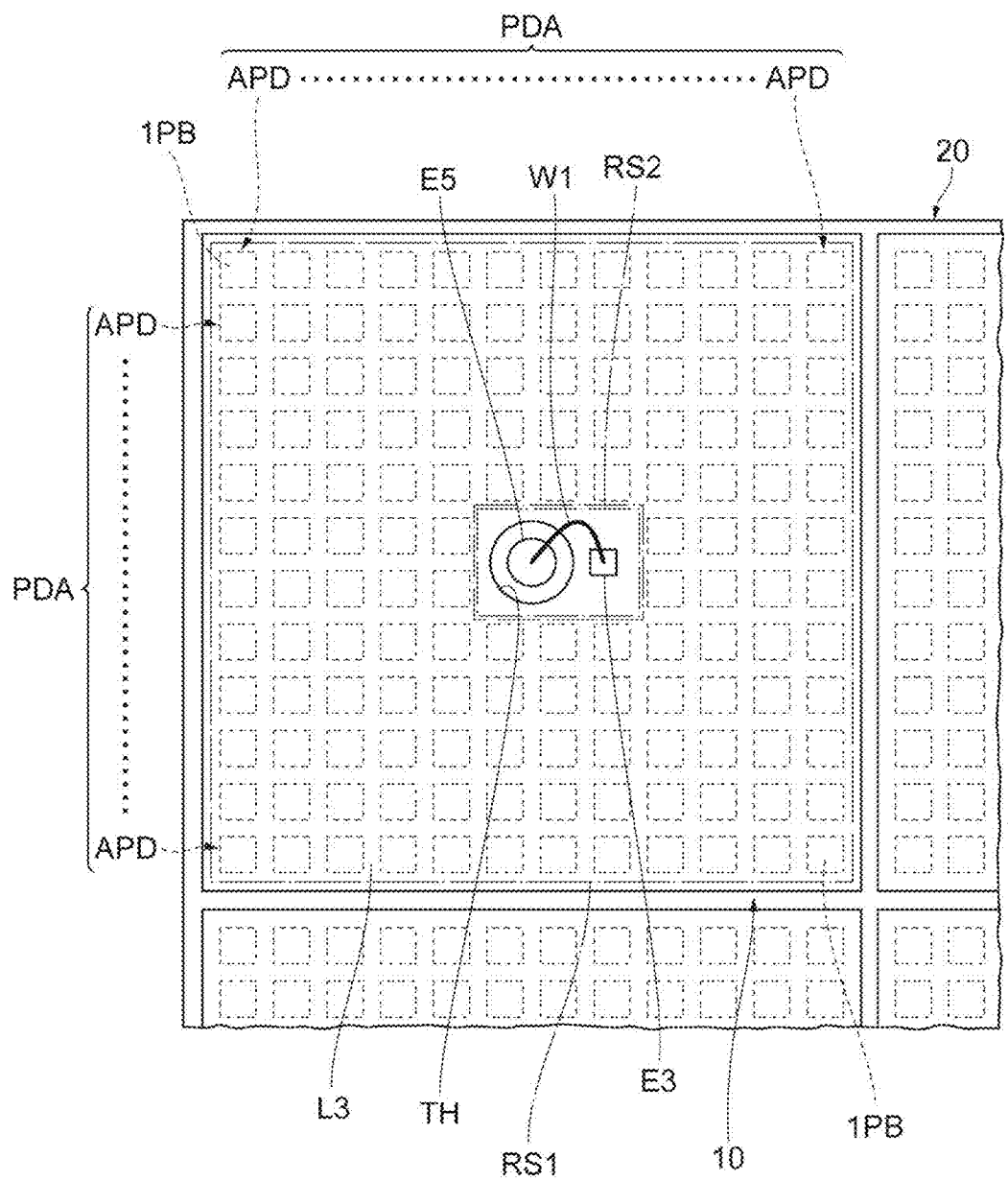
FIG. 4 is a schematic plan view of the semiconductor photodetecting element.
Figure 5:
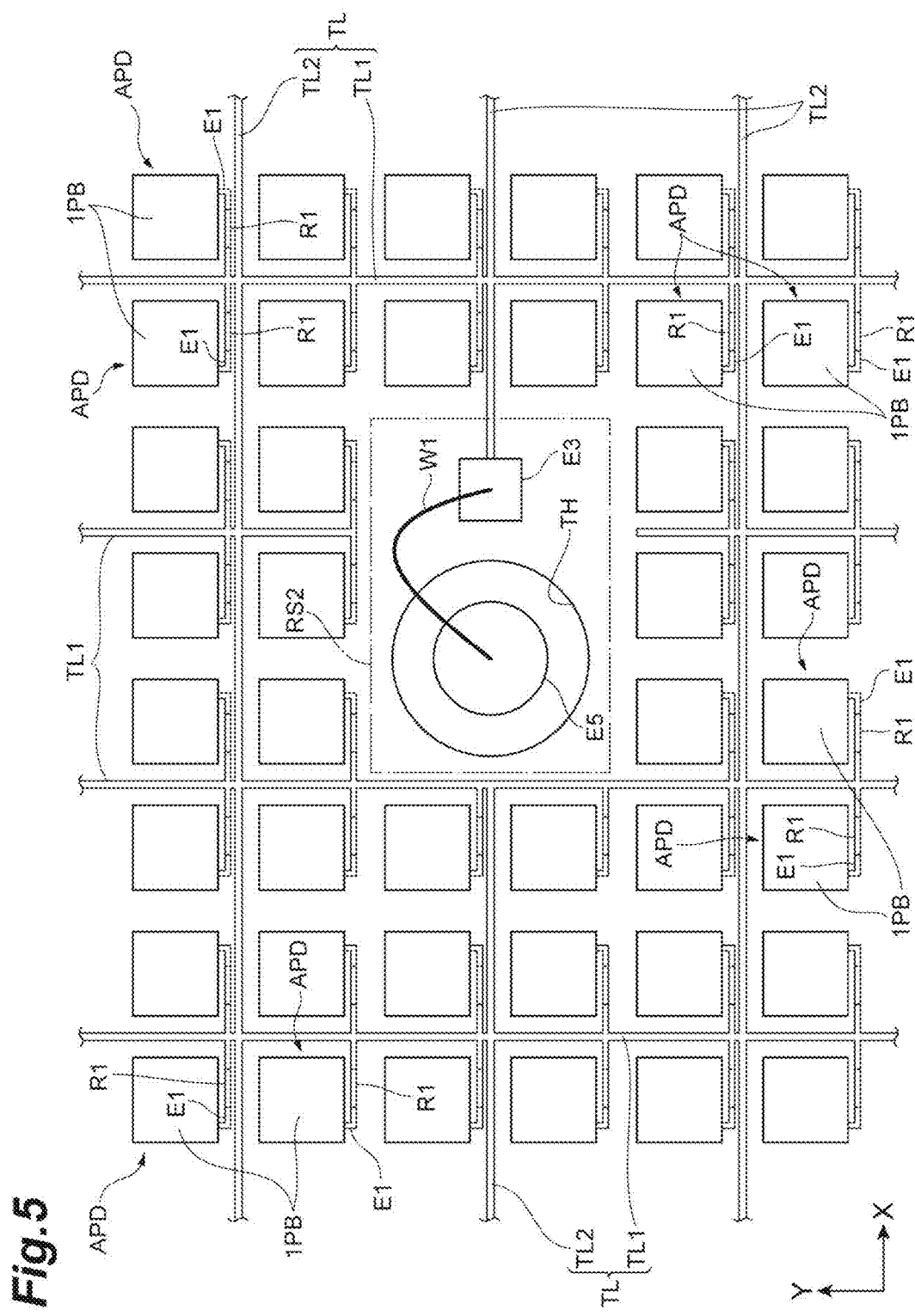
FIG. 5 is a schematic diagram illustrating a configuration of the semiconductor photodetecting element adjacent to a through-hole.
Figure 6:
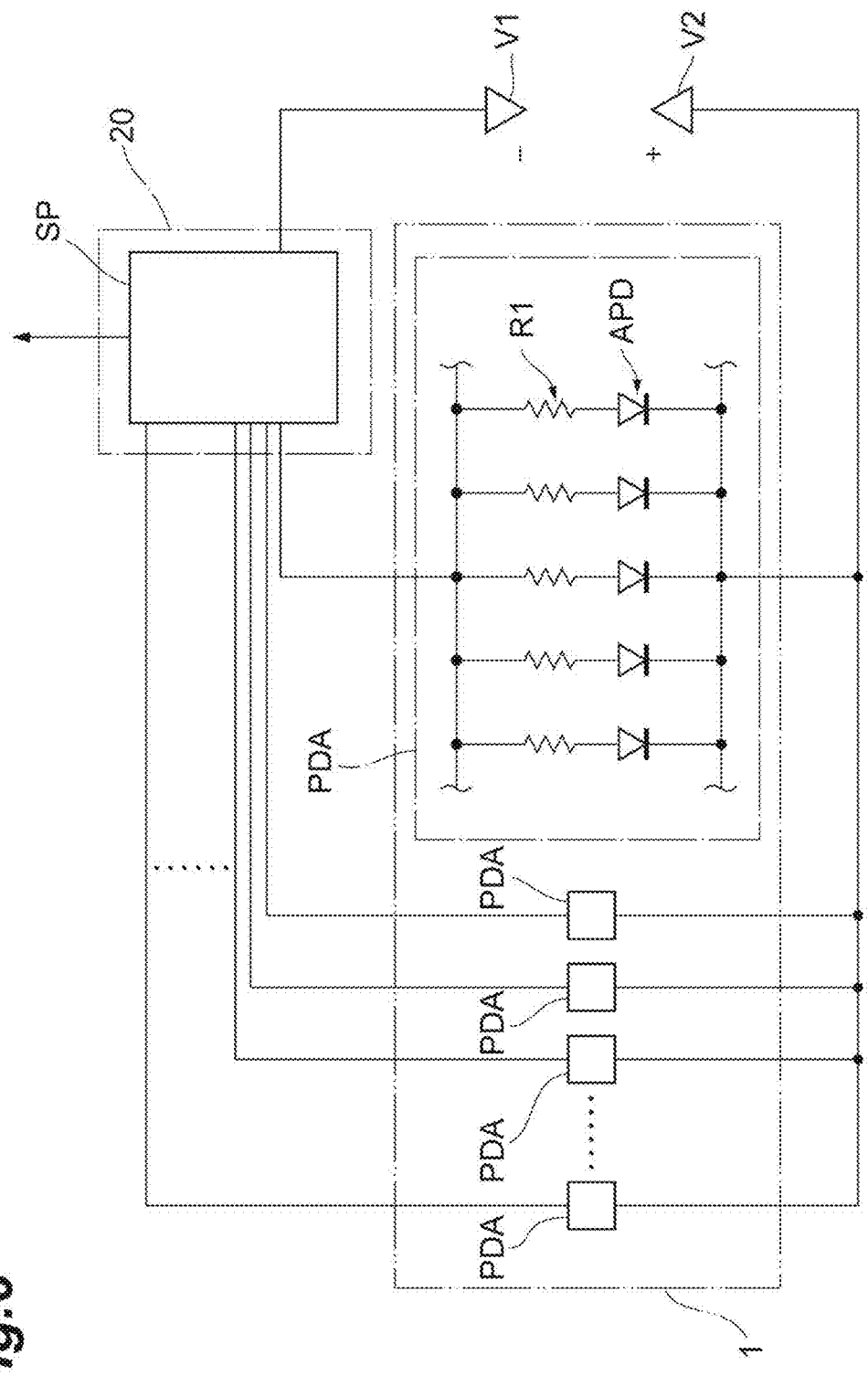
FIG. 6 is a circuit diagram of the photodetecting device.

A configuration of a photodetecting device 1 according to the present embodiment will be described with reference to FIGS. 1 to 6. FIG. 1 is a schematic perspective view illustrating the photodetecting device according to the present embodiment. FIG. 2 is a diagram for describing arrangement of a semiconductor photodetecting element. FIG. 3 is a diagram for describing a cross-sectional configuration of the photodetecting device according to the present embodiment. FIG. 4 is a schematic plan view of the semiconductor photodetecting element. FIG. 5 is a diagram illustrating a configuration of the semiconductor photodetecting element adjacent to a through-hole. FIG. 6 is a circuit diagram of the photodetecting device.

As illustrated in FIGS. 1 to 3, the photodetecting device 1 includes a plurality of semiconductor photodetecting elements 10, a mount substrate 20, and a plurality of scintillators 30. The plurality of semiconductor photodetecting elements 10 are disposed to oppose the mount substrate 20. The plurality of semiconductor photodetecting elements 10 are molded using resin (for example, epoxy resin) 11. In the present embodiment, the photodetecting device 1 includes the "sixteen" semiconductor photodetecting elements 10 and the "sixteen" scintillators 30.

Each of the semiconductor photodetecting elements 10 includes one photodiode array PDA. The semiconductor photodetecting element 10 includes a semiconductor substrate 1N. The semiconductor substrate 1N has a rectangular shape in a plan view. The semiconductor substrate 1N has a principal surface 1Na and a principal surface 1Nb that oppose each other. The semiconductor substrate 1N is an N-type (first conductive type) semiconductor substrate made of Si.

The photodiode array PDA includes a plurality of avalanche photodiodes APD. The plurality of avalanche photodiodes APD are formed in the semiconductor substrate 1N. One of the avalanche photodiodes APD constitutes one pixel in the photodiode array PDA. The plurality of avalanche photodiodes APD are two-dimensionally arranged when viewed from a direction (hereinafter, simply referred to as an "opposite direction") in which the principal surface 1Na and the principal surface 1Nb oppose each other.

As also illustrated in FIG. 4, the semiconductor substrate 1N includes a first region RS1 and a second region RS2. The plurality of avalanche photodiodes APD are disposed in the first region RS1. The second region RS2 is located inside the first region RS1 to be surrounded by the first region RS1 when viewed from the opposite direction. The first region RS1 is located substantially at the center of the semiconductor substrate 1N when viewed from the opposite direction. For example, the first region RS1 has a rectangular shape in a plan view.

A quenching resistor R1 is connected in series to each of the avalanche photodiodes APD as also illustrated in FIG. 5. All the avalanche photodiodes APD are connected in parallel with each other in the state of being connected in series to the quenching resistor R1. A reverse bias voltage is applied to each of the avalanche photodiodes APD from a power supply. An output current from the avalanche photodiode APD is detected by a signal processing unit SP which will be described later.

Each of the avalanche photodiodes APD has a first semiconductor region 1PA of P-type (second conductivity type) and a second semiconductor region 1PB of P-type. The first semiconductor region 1PA is formed in a principal surface 1Na side of the semiconductor substrate 1N. The second semiconductor region 1PB is formed in the first semiconductor region 1PA and has a higher impurity concentration than the first semiconductor region 1PA. A planar shape of the second semiconductor region 1PB is, for example, a polygon (quadrangle in the present embodiment). A depth of the first semiconductor region 1PA is larger than a depth of the second semiconductor region 1PB.

The semiconductor substrate 1N has an N-type semiconductor region 1PC. The semiconductor region 1PC is formed in the principal surface 1Na side of the semiconductor substrate 1N. The semiconductor region 1PC prevents a PN junction formed between the N-type semiconductor substrate 1N and the P-type first semiconductor region 1PA from being exposed to an edge of the semiconductor substrate 1N and a through-hole TH to be described later. The semiconductor region 1PC is formed at a position corresponding to the edge of the semiconductor substrate 1N and at a position corresponding to the through-hole TH.

As illustrated in FIG. 5, the avalanche photodiode APD has an electrode E1 disposed on a side of the principal surface 1Na of the semiconductor substrate 1N. The electrode E1 is electrically connected to the second semiconductor region 1PB. As illustrated in FIG. 3, the avalanche photodiode APD has an electrode E2 disposed on a side of the principal surface 1Nb of the semiconductor substrate 1N. The electrode E2 is electrically connected to the semiconductor substrate 1N. The first semiconductor region 1PA is electrically connected to the electrode E1 via the second semiconductor region 1PB.

As illustrated in FIG. 5, the photodiode array PDA has a signal line TL and an electrode E3. The signal line TL and the electrode E3 are formed on the semiconductor substrate 1N outside the second semiconductor region 1PB with an insulating layer L1 interposed therebetween. The signal line TL and the electrode E3 are disposed on the side of the principal surface 1Na of the semiconductor substrate 1N. The electrode E3 is located in the second region RS2. The signal line TL is connected to the electrode E3.

The signal line TL includes a plurality of signal lines TL1 and a plurality of signal lines TL2. In a plan view, each of the signal lines TL1 is disposed along a Y-axis direction between the avalanche photodiodes APD that are adjacent in an X-axis direction. Each of the signal lines TL2 is disposed along the X-axis direction between the avalanche photodiodes APD that are adjacent in the Y-axis direction. Each of the signal lines TL2 electrically connects the plurality of signal lines TL1 to each other. In the present embodiment, the signal line TL2 is connected to the electrode E3. The signal line TL1 may be connected to the electrode E3.

The photodiode array PDA includes the quenching resistor R1 for each of the avalanche photodiodes APD. The quenching resistors R1 are formed on the semiconductor substrate 1N with the insulating layer L1 interposed therebetween. The quenching resistors R1 are disposed on the side of the principal surface 1Na of the semiconductor substrate 1N. One end of the quenching resistor R1 is connected to the electrode E1. Another end of the quenching resistor R1 is connected to the signal line TL1. The quenching resistors R1 are, for example, located on the semiconductor substrate 1N outside the second semiconductor region 1PB. The insulating layers L1 and L3 illustrated in FIG. 3 are not illustrated in FIG. 5 to clarify the structure.

Each of the avalanche photodiode APD (a region immediately below the first semiconductor region 1PA) is connected to the signal line TL1 through the electrode E1 and the quenching resistor R1. Each of the plurality of avalanche photodiodes APD is connected to the single signal line TL1 via the electrode E1 and the quenching resistor R1. The quenching resistors R1 are electrically connected to the electrode E3 via the signal line TL. That is, each of the avalanche photodiodes APD (each pixel) is electrically connected to the electrode E3.

The insulating layer L3 is disposed on the side of the principal surface 1Na of the semiconductor substrate 1N. The insulating layer L3 is formed to cover the electrodes E1 and E3, the quenching resistor R1, and the signal line TL.

The through-hole TH penetrating through the semiconductor substrate 1N is formed in the second region RS2 of the semiconductor substrate 1N. An opening of the through-hole TH has a circular shape. An inner diameter of the through-hole TH is not substantially changed in a length direction of the through-hole TH. For example, dry etching, wet etching, drilling, laser processing, and sandblasting are appropriately selected as a method of forming the through-hole TH.

The quenching resistors R1 have a higher resistivity than the electrode E1 to which the quenching resistor R1 is connected. The quenching resistors R1 are made of polysilicon, for example. A chemical vapor deposition (CVD) method can be used as a method of forming the quenching resistors R1.

The electrodes E1, E2 and E3 and the signal line TL are made of metal (for example, Al). When the semiconductor substrate is made of Si, AuGe/Ni is also used as the electrode material instead of Al. A sputtering method can be used as a method of forming the electrodes E1, E2 and E3 and the signal line TL.

When Si is used as the material of the semiconductor substrate 1N, a Group III element (for example, B) is used for a P-type impurity and a Group V element (for example, N, P, or As) is used for an N-type impurity. Even though an element is configured by substituting the N-type and the P-type as the conductivity types of the semiconductor with each other, the element can function. A diffusion method or an ion implantation method can be used as a method of adding these impurities.

It is possible to use $SiO_2$ or SiN as a material of the insulating layers L1 and L3. When the insulating layers L1 and L3 are made of $SiO_2$, a thermal oxidation method or a sputtering method can be used as a method of forming the insulating layers L1 and L3.

In the photodiode array PDA, the PN junction is formed between the N-type semiconductor substrate 1N and the P-type first semiconductor region 1PA, whereby the avalanche photodiode APD is formed. The semiconductor substrate 1N is electrically connected to the electrode E2 which is formed on the principal surface 1Nb of the semiconductor substrate 1N. The first semiconductor region 1PA is connected to the electrode E1 via the second semiconductor region 1PB. The quenching resistor R1 is connected in series to the avalanche photodiode APD (see FIG. 6).

In the photodiode array PDA, each of the avalanche photodiodes APD operates in a Geiger mode. In the Geiger mode, a reverse voltage (reverse bias voltage) larger than a breakdown voltage of the avalanche photodiode APD is applied between an anode and a cathode of the avalanche photodiode APD. That is, a (−) potential V1 is applied to the anode, and a (+) potential V2 is applied to the cathode. Polarities of these potentials are relative, and one of the potentials can be also set to a ground potential.

The anode is the P-type first semiconductor region 1PA and the cathode is the N-type semiconductor substrate 1N. When light (a photon) is incident on the avalanche photodiode APD, photoelectric conversion is performed inside the substrate to generate a photo electron. Avalanche multiplication is performed in a region near an interface of the PN junction of the first semiconductor region 1PA, and an amplified electron group flows toward the electrode E2. That is, when light (photon) is incident on any pixel (avalanche photodiode APD) of the photodiode array PDA, the light is multiplied and taken out from the electrode E3 as a signal.

The other end of the quenching resistor R1 connected to each of the avalanche photodiodes APD is electrically connected to the common signal line TL along the principal surface 1Na of the semiconductor substrate 1N. Each of the avalanche photodiodes APD operates in the Geiger mode and is connected to the common signal line TL. Thus, when photons are simultaneously incident on the plurality of avalanche photodiodes APD, the entire output from the plurality of avalanche photodiodes APD is input to the common signal line TL. Therefore, a signal of high intensity corresponding to the number of incident photons is measured in the photodiode array PDA. The signal is output through the electrode E3 in each of the semiconductor photodetecting elements 10 (each of the photodiode arrays PDA).

As also illustrated in FIG. 3, the mount substrate 20 has a principal surface 20a and a principal surface 20b that oppose each other. The mount substrate 20 has a rectangular shape in a plan view. The principal surface 20a opposes the principal surface 1Nb of the semiconductor substrate 1N. Each of the semiconductor photodetecting elements 10 is disposed on the mount substrate 20 in such a manner that the principal surface 1Nb of the semiconductor substrate 1N opposes the principal surface 20a. The respective semiconductor photodetecting elements 10 are two-dimensionally arranged on the mount substrate 20.

The mount substrate 20 includes a plurality of electrodes E5 and a plurality of electrodes E7. The electrode E5 and the electrode E7 are disposed at positions corresponding to the respective semiconductor photodetecting elements 10 (respective photodiode arrays PDA). The electrode E5 and the electrode E7 are disposed on a side of principal surface 20a.

As illustrated in FIG. 3, the electrode E5 is disposed at a position corresponding to the through-hole TH. That is, the electrode E5 is formed on each region opposing the through-hole TH in the principal surface 20a. The electrode E5 is exposed inside the through-hole TH when viewed from the opposite direction (the direction in which the principal surface 20a opposes the principal surface 20b). The electrode E7 is disposed at a position corresponding to the electrode E2 as illustrated in FIG. 3. That is, the electrode E7 is formed on each region opposing the electrode E2 in the principal surface 20a.

The mount substrate 20 includes a plurality of electrodes E6 and a plurality of electrodes E8. The electrode E6 and the electrode E8 are disposed on a side of the principal surface 20b. The electrode E6 is electrically connected to the corresponding electrode E5. The electrode E8 is electrically connected to the corresponding electrode E7. The electrodes E5, E6, E7 and E8 are made of metal (for example, Al), as with the electrodes E1, E2 and E3. As the electrode material, AuGe/Ni may be used instead of Al.

The electrode E3 and the electrode E5 are connected to each other by a bonding wire W1. Therefore, the electrode E3 is electrically connected to the electrode E5 via the bonding wire W1. The quenching resistors R1 are electrically connected to the electrode E5 via the signal line TL, the electrode E3, and the bonding wire W1. The bonding wire W1 is inserted through the through-hole TH. The bonding wire W1 is made of, for example, Al, Cu, or Au.

The electrode E2 and the electrode E7 are connected to each other by, for example, a conductive resin 21. Therefore, the electrode E2 is electrically connected to the electrode E7 via the conductive resin 21. The conductive resin 21 contains conductive filler and resin. For example, Ag powder is used as the conductive filler.

The signal processing unit SP is disposed, for example, on the principal surface 20b side of the mount substrate 20. The signal processing unit SP constitutes an application specific integrated circuit (ASIC). Each of the electrodes E6 is electrically connected to the signal processing unit SP via a wiring and the bonding wire (both are not illustrated) and the like formed on the mount substrate 20. An output signal from each of the semiconductor photodetecting elements 10 (each of the photodiode arrays PDA) is input to the signal processing unit SP, and the signal processing unit SP processes the output signal from each of the semiconductor photodetecting elements 10. The signal processing unit SP includes a CMOS circuit that converts an output signal from each of the semiconductor photodetecting elements 10 into a digital pulse. The signal processing unit SP may be disposed on a substrate different from the mount substrate 20.

Each of the scintillators 30 is optically connected to the resin 11 by an optical adhesive 31. The scintillator 30 is disposed at a position corresponding to each of the semiconductor photodetecting elements 10 (each of the photodiode arrays PDA). Scintillation light from the scintillator 30 passes through the optical adhesive 31 and the resin 11 and is incident on the semiconductor photodetecting element 10. The number of the scintillators 30 is the same as the number of the semiconductor photodetecting elements 10, and the scintillator 30 and the semiconductor photodetecting element 10 correspond one to one.

As described above, in the present embodiment, the through-hole TH is formed in the second region RS2 when viewed from the opposite direction. The second region RS2 is located inside the first region RS1 to be surrounded by the first region RS1. The bonding wire W1 is inserted through the through-hole TH. The bonding wire W1 connects the electrode E3 and the electrode E5. Therefore, the signal of the photodiode array PDA is taken out from the principal surface 1Na side of the semiconductor substrate 1N and sent to the principal surface 20a side of the mount substrate 20.

The through-hole TH is formed in the second region RS2 of the semiconductor substrate 1N. Thus, a difference in wiring distance between the pixels is small in the photodetecting device 1, as compared with in a photodetecting device to be compared in which a wire is disposed at a notch formed at a corner of a semiconductor substrate. Therefore, a difference in signal arrival time between the avalanche photodiodes APD (pixels) can be suppressed to be small.

In each of the photodiode arrays PDA, when the avalanche photodiode APD constituting the pixel detects photons and performs the Geiger discharge, a pulsed signal is obtained by the function of the quenching resistor R1 connected to the avalanche photodiode APD. Each of the avalanche photodiodes APD counts the respective photons. Thus, even when a plurality of photons are incident at the same timing, the number of incident photons is determined in response to an output charge amount or a signal intensity of the total output pulse. Since the difference in signal arrival time between the avalanche photodiodes APD is suppressed to be small in the photodetecting device 1, deterioration in temporal resolution can be suppressed.

When a through-hole is formed in a region located inside a region in which a plurality of pixels are disposed, it is difficult to disposed a pixel in the region in which the through-hole is formed. Since a light receiving pixel and a display pixel are paired at the time of normal imaging, a defect of the light receiving pixel becomes a defect of the display pixel. For this reason, no through-hole is formed in the above-described region in general. In the present embodiment, the semiconductor photodetecting element 10 includes the photodiode array PDA, and the entire output of the plurality of avalanche photodiodes APD is input to the common signal line TL. Since the semiconductor photodetecting element 10 and the display pixel are paired at the time of imaging, a defect of the display pixel caused by the presence of the second region RS2 does not occur.

In the present embodiment, the photodetecting device 1 includes the plurality of semiconductor photodetecting elements 10. Each of the semiconductor photodetecting elements 10 is disposed on the mount substrate 20 in such a manner that the principal surface 1Nb of the semiconductor substrate 1N opposes the principal surface 20a of the mount substrate 20. The electrode E3 and the electrode E5 are connected to each other via the bonding wire W1 for each of the semiconductor photodetecting elements 10. Since the photodetecting device 1 includes the plurality of semiconductor photodetecting elements 10, the area of a light receiving region of the photodetecting device 1 is increased. As described above, in each of the semiconductor photodetecting elements 10, the difference in signal arrival time between the avalanche photodiodes APD is suppressed to be small.

In the present embodiment, the second region RS2 is located substantially at the center of the first region RS1 when viewed from the opposite direction. This configuration further reduces the difference in signal arrival time between the avalanche photodiodes APD.

A diameter of the through-hole TH depends on an outer diameter of a capillary so that the capillary used for connection of the bonding wire W1 can be inserted through the through-hole TH. In the present embodiment, since the opening of the through-hole TH has the circular shape, the area for formation of the through-hole TH is small, as compared with in a configuration in which the opening of the through-hole TH has another shape. Therefore, it is possible to suppress a decrease of an aperture ratio in each of the semiconductor photodetecting elements 10.

In the present embodiment, the semiconductor photodetecting element 10 and the scintillator 30 are tiled on the mount substrate 20 in such a manner that the semiconductor photodetecting element 10 and the scintillator 30 are coupled one by one. Even in which case, the scintillator light emitted from one of the scintillators 30 is incident not only on the semiconductor photodetecting element 10 coupled to the scintillator 30, but also on the semiconductor photodetecting element 10 adjacent to the semiconductor photodetecting element 10. Thus, discrimination of a crystal position is carried out in order to obtain a larger output from the semiconductor photodetecting element 10, for example, by performing barycentric calculation using signal outputs of the two-adjacent semiconductor photodetecting elements 10. In which case, an image of the crystal position discrimination is distorted so that it is difficult to obtain an accurate image if an output variation occurs between the two-adjacent semiconductor photodetecting elements 10.

In the above-described photodetecting device to be compared, the plurality of semiconductor photodetecting elements are tiled in such a manner that a side on which the notch is formed and a side on which the notch is not formed are adjacent to each other. In the semiconductor photodetecting element in which the notch is formed, the number of light receiving pixels on the side on which the notch is formed is smaller than the number of light receiving pixels on the side on which the notch is not formed due to the notch being formed. In the above-described photodetecting device to be compared, the number of light receiving pixels differs between two adjacent semiconductor photodetecting elements, and thus, it is difficult to avoid the output variation between the two semiconductor photodetecting elements.

In contrast, in the present embodiment, since the through-hole TH configured to dispose the bonding wire W1 is formed in the second region RS2, the number of light receiving pixels does not differ between the two-adjacent semiconductor photodetecting elements 10. Therefore, the output variation between the two-adjacent semiconductor photodetecting elements 10 hardly occurs.

In the above-described photodetecting device to be compared, when the plurality, of semiconductor photodetecting elements are tiled in such a manner that an interval between two adjacent semiconductor photodetecting elements is narrow, the following problems may occur. Scintillator light is reflected by an electrode that is disposed on the mount substrate and to which a wire is connected. The scintillator light reflected by the electrode is further reflected by the scintillator and is incident on the adjacent semiconductor photodetecting element.

In the present embodiment, the through-hole TH is formed in the second region RS2. Thus, even when scintillation light is reflected by the electrode E5 and the scintillation light reflected by the electrode E5 is further reflected by the scintillator 30, there is an extremely high possibility that the scintillator light is incident on the semiconductor photodetecting element 10 on which the scintillator light should be originally incident. Therefore, even when the scintillator light is reflected by the electrode E5, it is possible to suppress the scintillator light from being incident on the adjacent semiconductor photodetecting element 10.

In the above-described photodetecting device to be compared, the electrode on a side of the semiconductor substrate to which the wire is connected is disposed adjacent to the notch. The notch is formed at the corner of the semiconductor substrate. Thus, chipping may occur in a region of the semiconductor substrate where the above-described electrode is formed at the time of dicing a semiconductor wafer. In the present embodiment, the through-hole TH is formed in the second region RS2. Thus, even when the semiconductor substrate 1N is obtained by dicing the semiconductor wafer, there is no risk that chipping may reach a region where the electrode E2 is disposed.

It is conceivable to adopt a configuration in which a signal is taken out from the semiconductor photodetecting element through a through electrode, instead of the configuration of outputting the signal from the semiconductor photodetecting element to the mount substrate through the bonding wire. The through electrode is formed in the semiconductor substrate, for example, to penetrate through the semiconductor substrate. In which case, it is necessary to form an insulating layer, a conductor layer serving as the through electrode, an insulating layer to insulate the conductor layer, and the like on the semiconductor substrate from a back-surface side of the semiconductor substrate by patterning, and thus, the manufacturing cost may increase. In contrast, in the present embodiment, it is unnecessary to form the above-described insulating layer and conductor layer, and there is no risk that the manufacturing cost may increase.

In the configuration in which the signal is taken out using the through electrode, it is necessary to dispose the insulating layer between the conductor layer serving as the through electrode and the semiconductor substrate. Therefore, a stray capacitance is formed between the conductor layer and the semiconductor substrate, and the wiring capacitance of the semiconductor photodetecting element may increase. In contrast, in the present embodiment, since no stray capacitance is substantially formed between the bonding wire W1 and the semiconductor substrate 1N, it is possible to suppress the increase in wiring capacitance of the semiconductor photodetecting element.

In the configuration in which the signal is taken out using the through electrode, it is necessary to bump-connect the semiconductor photodetecting element and the mount substrate. Therefore, a contact area between the semiconductor photodetecting element and the mount substrate is narrow, and heat dissipation performance of the semiconductor photodetecting element may deteriorate. When the semiconductor photodetecting element and the mount substrate are bump-connected, a connection resistance between the semiconductor photodetecting element and the mount substrate may increase.

In the present embodiment, the principal surface 1Nb of the semiconductor substrate 1N of the semiconductor photodetecting element 10 is thermally connected to the principal surface 20a of the mount substrate 20, and thus, the heat dissipation performance of the semiconductor photodetecting element 10 is improved. The electrode E3 and the electrode E5 are electrically connected through the bonding wire W1, and the electrode E2 having a large area and the electrode E7 are electrically connected to each other. Therefore, there is no risk that a connection resistance between the semiconductor photodetecting element 10 and the mount substrate 20 may increase.

When the through-hole TH is formed in a tapered shape in such a manner that a diameter thereof gradually decreases from the principal surface 1Na to the principal surface 1Nb, a dead space on the principal surface 1Na of the semiconductor substrate 1N is large. When the through-hole TH is formed in a tapered shape in such a manner that a diameter thereof gradually increases from the principal surface 1Na to the principal surface 1Nb, a problem described below may occur. When the electrode E3 is disposed adjacent to the through-hole TH, it is difficult for the capillary to sufficiently press a distal end of the wire to the electrode E3 at the time of wire bonding. Thus, the electrode E3 and the wire may not be properly connected. Therefore, it is necessary to dispose the electrode E3 away from the through-hole TH, and the area of the second region RS2 becomes large.

In the present embodiment, since the inner diameter of the through-hole TH is not substantially changed in the length direction of the through-hole TH, it is possible to dispose the electrode E3 adjacent to the through-hole TH. As a result, it is possible to suppress the increase of the area of the second region RS2 and to suppress the decrease of the aperture ratio in the semiconductor photodetecting element.

Figure 7:
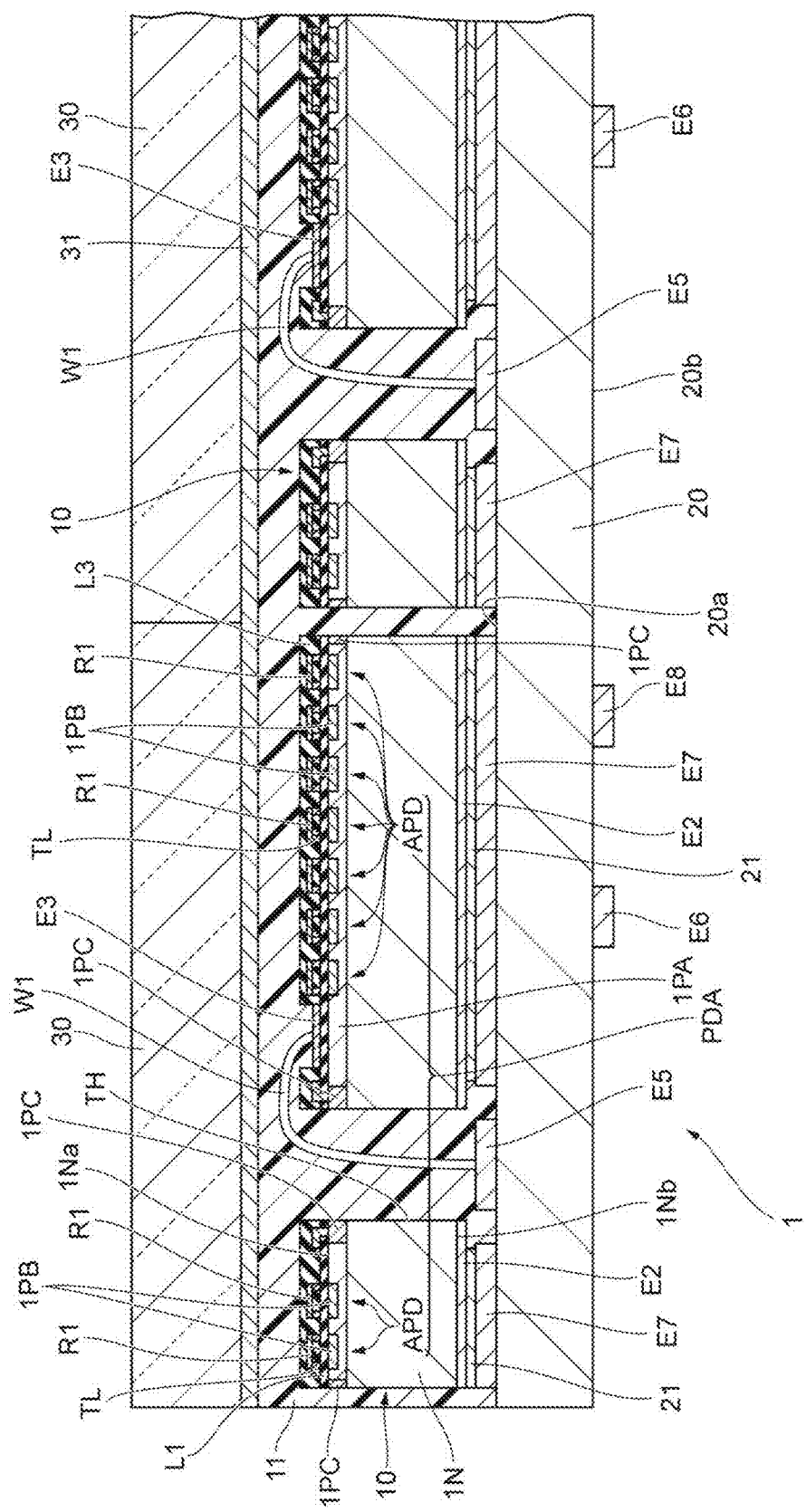
FIG. 7 is a diagram for describing a cross-sectional configuration of a photodetecting device according to a modified example of the present embodiment.
Figure 8:
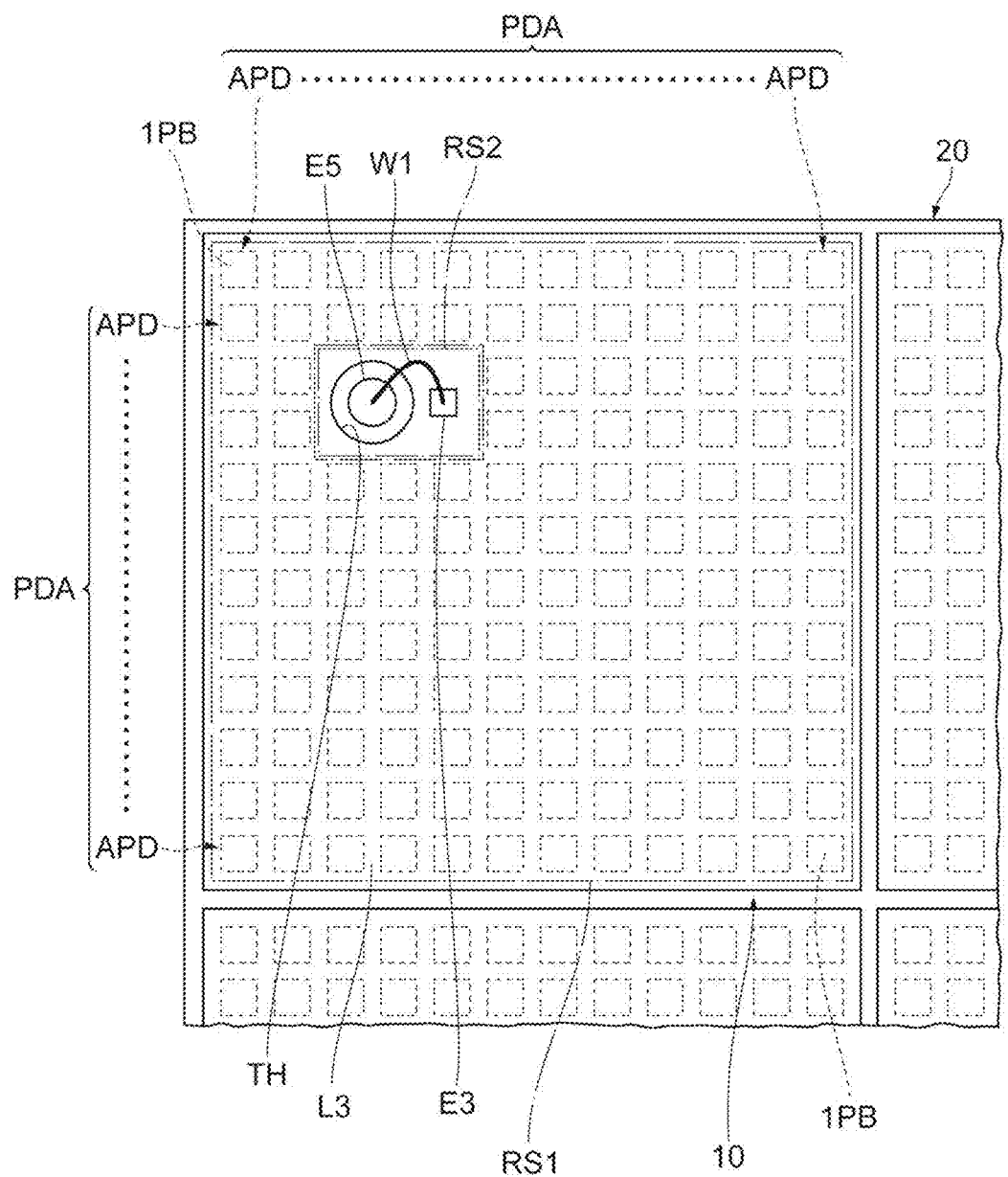
FIG. 8 is a schematic plan view of the semiconductor photodetecting element.

Next, a configuration of the photodetecting device 1 according to a modified example of the present embodiment will be described with reference to FIGS. 7 and 8. FIG. 7 is a diagram for describing a cross-sectional configuration of the photodetecting device according to the present modified example. FIG. 8 is a schematic plan view of the semiconductor photodetecting element. In the present modified example, a position of the second region RS2, that is, a position where the through-hole TH is formed is different from that in the above-described embodiment.

In the modified examples illustrated in FIGS. 7 and 8, the second region RS2 is located to be deviated from substantially the center of the first region RS1. Even in which case, the second region RS2 is located inside the first region RS1 to be surrounded by the first region RS1 when viewed from the opposite direction.

Even in the present modified example, a difference in wiring distance between pixels is small, as compared with in the above-described photodetecting device to be compared, as with the above-described embodiment. Thus, even in the photodetecting device 1 according to the present modified example, it is possible to suppress a difference in signal arrival time between the avalanche photodiodes APD (pixels) to be small. When in-plane distribution of emission intensity of the scintillator 30 is the maximum in a center portion, the second region RS2 is deviated from substantially the center of the first region RS1, whereby the amount of received scintillator light increases.

Figure 9:
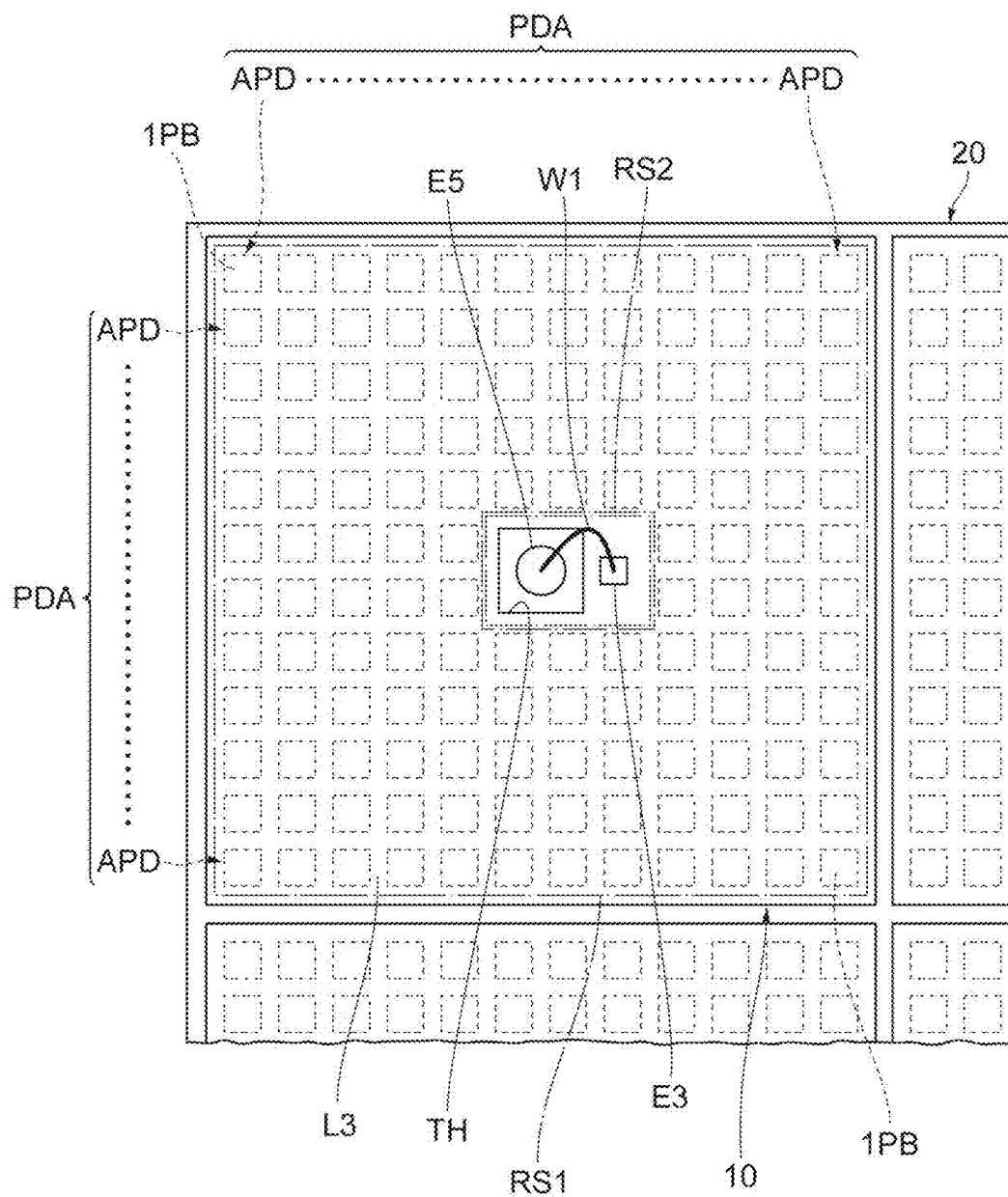
FIG. 9 is a schematic plan view illustrating a modified example of the semiconductor photodetecting element.
Figure 10:
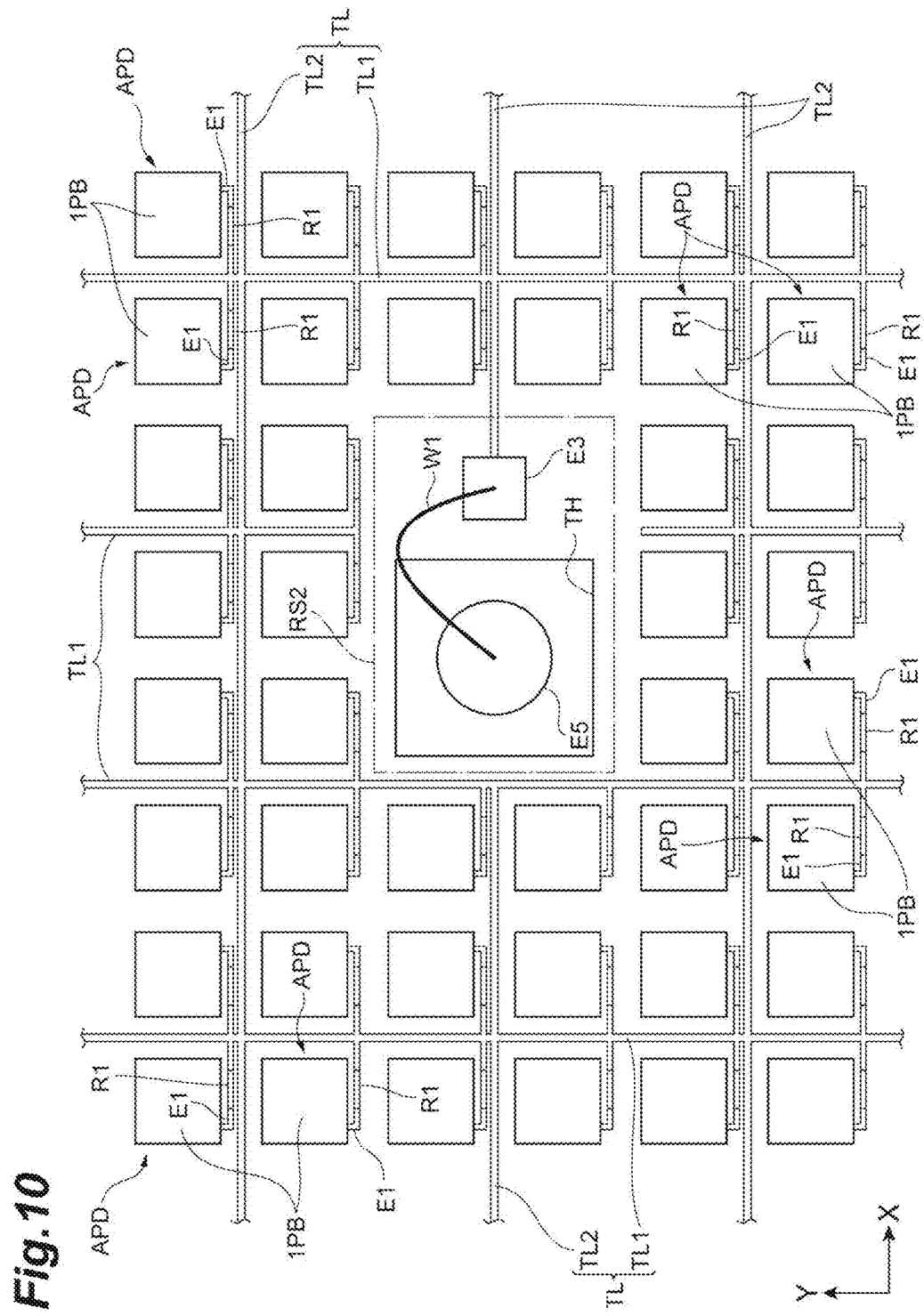
FIG. 10 is a schematic diagram illustrating a configuration of the semiconductor photodetecting element adjacent to a through-hole.
Figure 11:
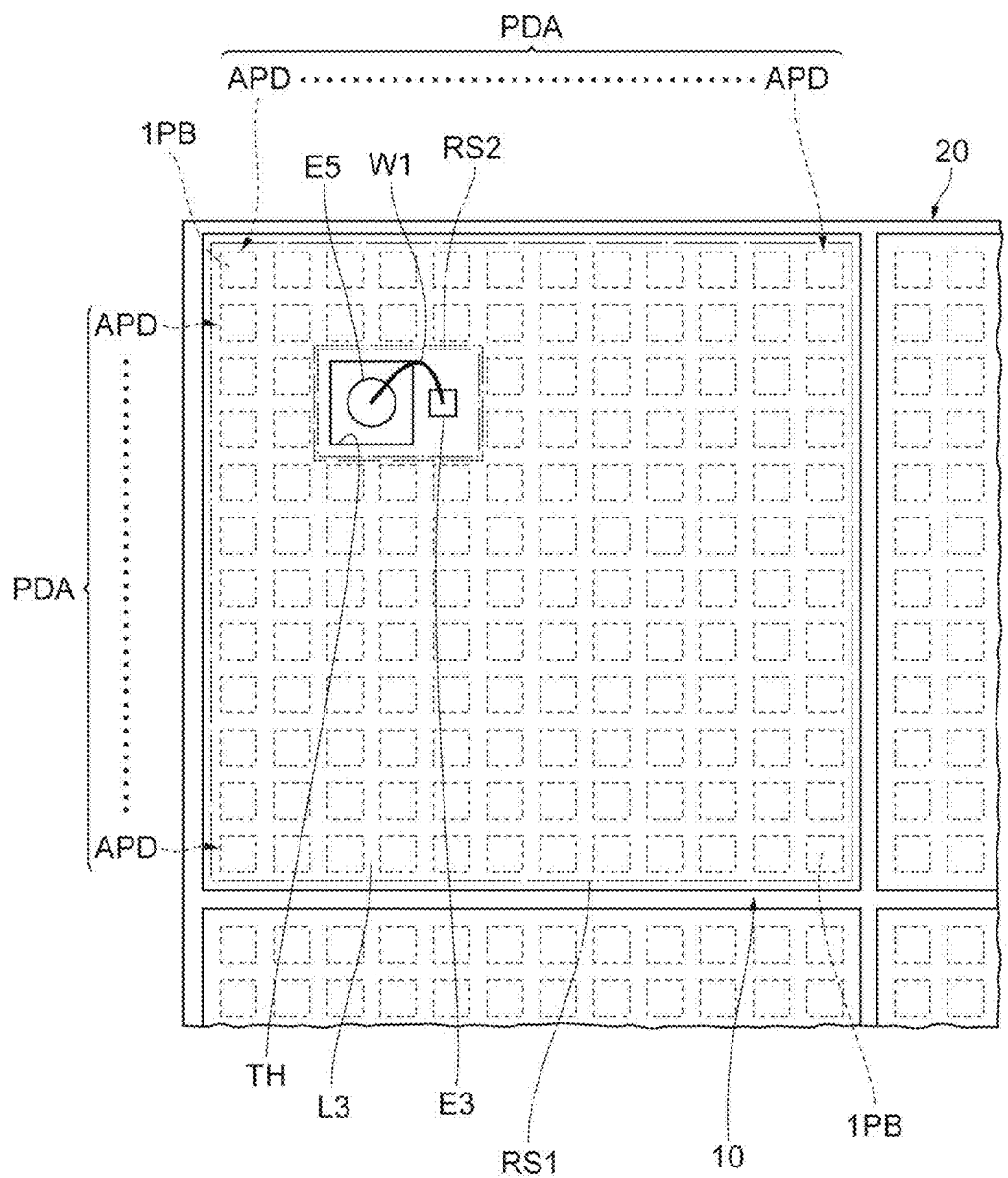
FIG. 11 is a schematic plan view illustrating a modified example of the semiconductor photodetecting element.

Next, a configuration of a modified example of the semiconductor photodetecting element 10 will be described with reference to FIGS. 9 to 11. FIGS. 9 and 11 are schematic plan views illustrating the modified example of the semiconductor photodetecting element. FIG. 10 is a schematic diagram illustrating the configuration of the semiconductor photodetecting element adjacent to a through-hole. In the present modified example, a shape of an opening of the through-hole TH is different from that in the above-described embodiment.

In the modified example illustrated in FIGS. 8 to 10, the opening of the through-hole TH has a rectangular shape. The opening of the through-hole TH has a square shape in the present modified example. In which case, distances from an edge of the through-hole TH to the avalanche photodiodes APD (respective pixels) located around the through-hole TH are equal, and thus, it is possible to suppress occurrence of a characteristic variation among the avalanche photodiodes APD.

Figure 12:
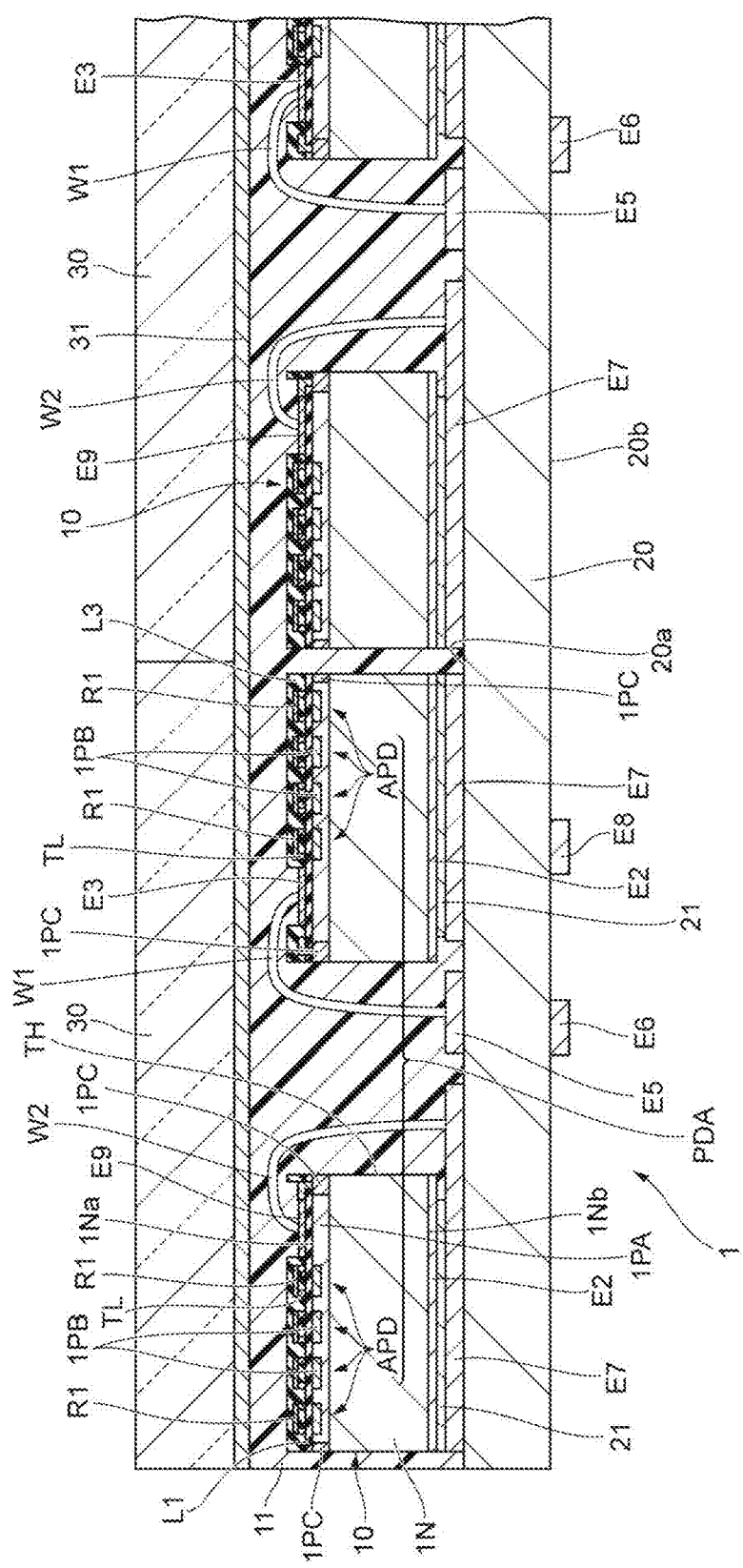
FIG. 12 is a diagram for describing a cross-sectional configuration of a photodetecting device according to a modified example of the present embodiment.
Figure 13:
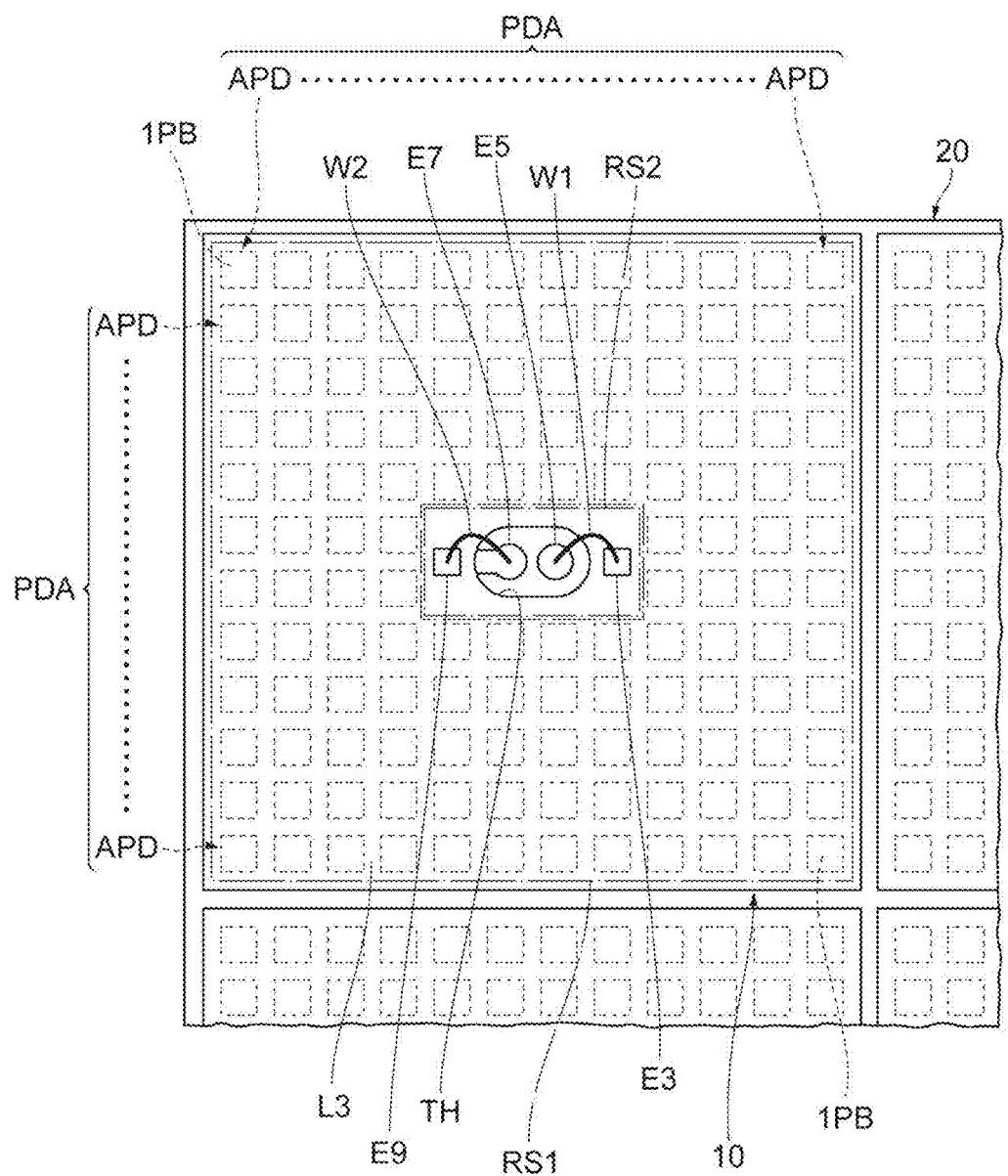
FIG. 13 is a schematic plan view of the semiconductor photodetecting element.
Figure 14:
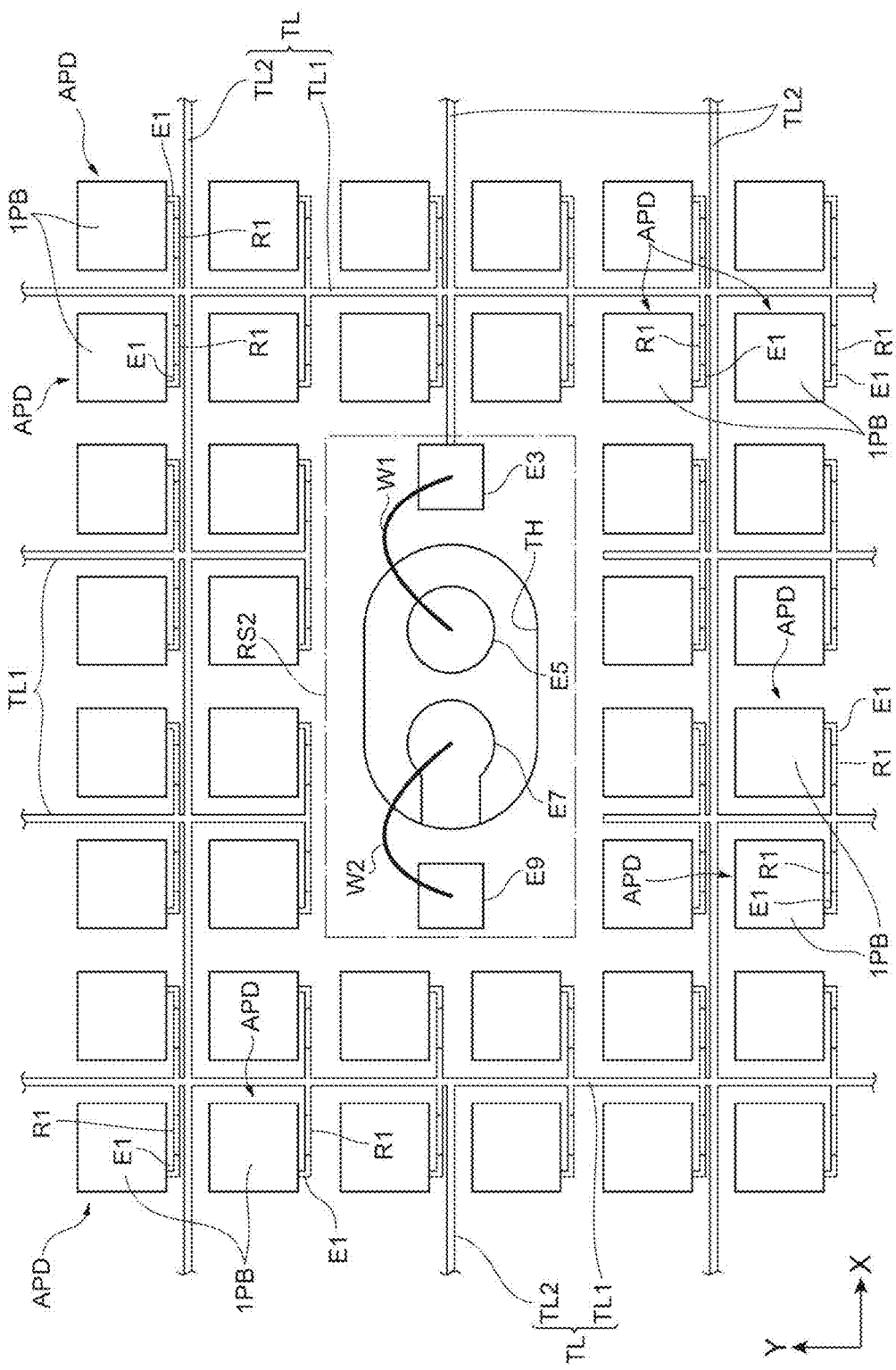
FIG. 14 is a schematic diagram illustrating a configuration of the semiconductor photodetecting element adjacent to a through-hole.

Next, a configuration of the photodetecting device 1 according to a modified example of the present embodiment will be described with reference to FIGS. 12 to 14. FIG. 12 is a diagram for describing a cross-sectional configuration of the photodetecting device according to the present modified example. FIG. 13 is a schematic plan view of the semiconductor photodetecting element. FIG. 14 is a schematic diagram illustrating the configuration of the semiconductor photodetecting element in the vicinity of a through-hole. The present modified example is different from the above-described embodiment in terms that two bonding wires W1 and W2 are inserted through each of the through-holes TH.

In the modified example illustrated in FIGS. 12 to 14, an opening of the through-hole TH has an oval shape. An inner diameter of the through-hole TH is not substantially changed in a length direction of the through-hole TH. Not only the electrode E5 but also a part of the electrode E7 is exposed inside the through-hole TH when viewed from the opposite direction (direction in which the principal surface 20a and the principal surface 20b oppose each other). The part of the electrode E7 and the electrode E5 exposed inside the through-hole TH are disposed side by side along a long-axis direction in the opening shape of the through-hole TH.

The avalanche photodiode APD includes an electrode E9 disposed on the side of the principal surface 1Na of the semiconductor substrate 1N. The electrode E9 is connected to the N-type semiconductor region 1PC through a via formed in the insulating layer L1. The electrode E9 is electrically connected to the semiconductor substrate 1N via the semiconductor region 1PC. The electrode E9 and the electrode E3 are located to sandwich the through-hole TH in the long-axis direction in the opening shape of the through-hole TH when viewed from the opposite direction.

The electrode E9 and the electrode E7 are connected to each other by the bonding wire W2. Therefore, the electrode E9 is electrically connected to the electrode E7 via the bonding wire W2. The semiconductor substrate 1N is electrically connected to the electrode E7 via the semiconductor region 1PC, the electrode E9, and the bonding wire W2. The bonding wire W2 is inserted through the through-hole TH together with the bonding wire W1. As with the bonding wire W1, the bonding wire W2 is made of Al, Cu, or Au, for example.

The electrode E2 is not disposed on the side of principal surface 1Nb of the semiconductor substrate 1N. In the present modified example, the principal surface 1Nb of the semiconductor substrate 1N is directly connected to the electrode E7 by the conductive resin 21. Therefore, the semiconductor substrate 1N is electrically connected to the electrode E7 via the conductive resin 21.

Even in the present modified example, a difference in wiring distance between pixels is small, as compared with in the above-described photodetecting device to be compared, as with the above-described embodiment. Thus, it is possible to suppress a difference in signal arrival time between the avalanche photodiodes APD (pixels) to be small even in the photodetecting device 1 according to the present modified example.

The electrode E9 and the electrode E7 are connected via the bonding wire W2 inserted through the through-hole TH. In which case, it is possible to properly apply a cathode potential to the semiconductor substrate 1N through the bonding wire W2 and the electrode E9. Therefore, it is unnecessary to dispose an electrode configured to apply the cathode potential to the semiconductor substrate 1N on the side of principal surface 1Nb of the semiconductor substrate 1N, and thus, it is possible to reduce the manufacturing cost of the semiconductor photodetecting element 10. Since the bonding wire W2 is inserted through the through-hole TH through which the bonding wire W1 is inserted, there is no need to newly form a through-hole through which the bonding wire W2 is inserted. Consequently, it is possible to further reduce the manufacturing cost of the semiconductor photodetecting element 10.

Figure 15:
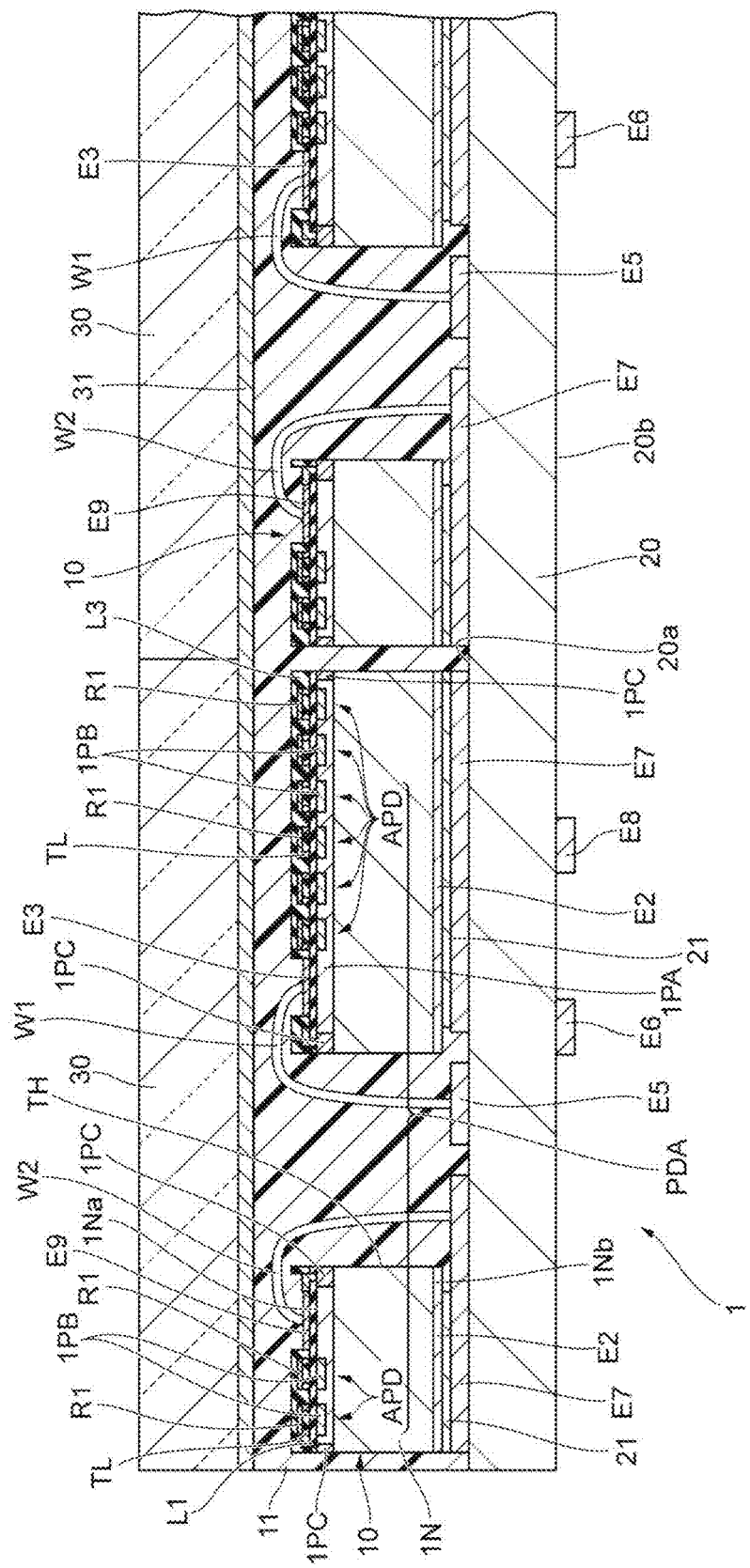
FIG. 15 is a diagram for describing a cross-sectional configuration of a photodetecting device according to a modified example of the present embodiment.
Figure 16:
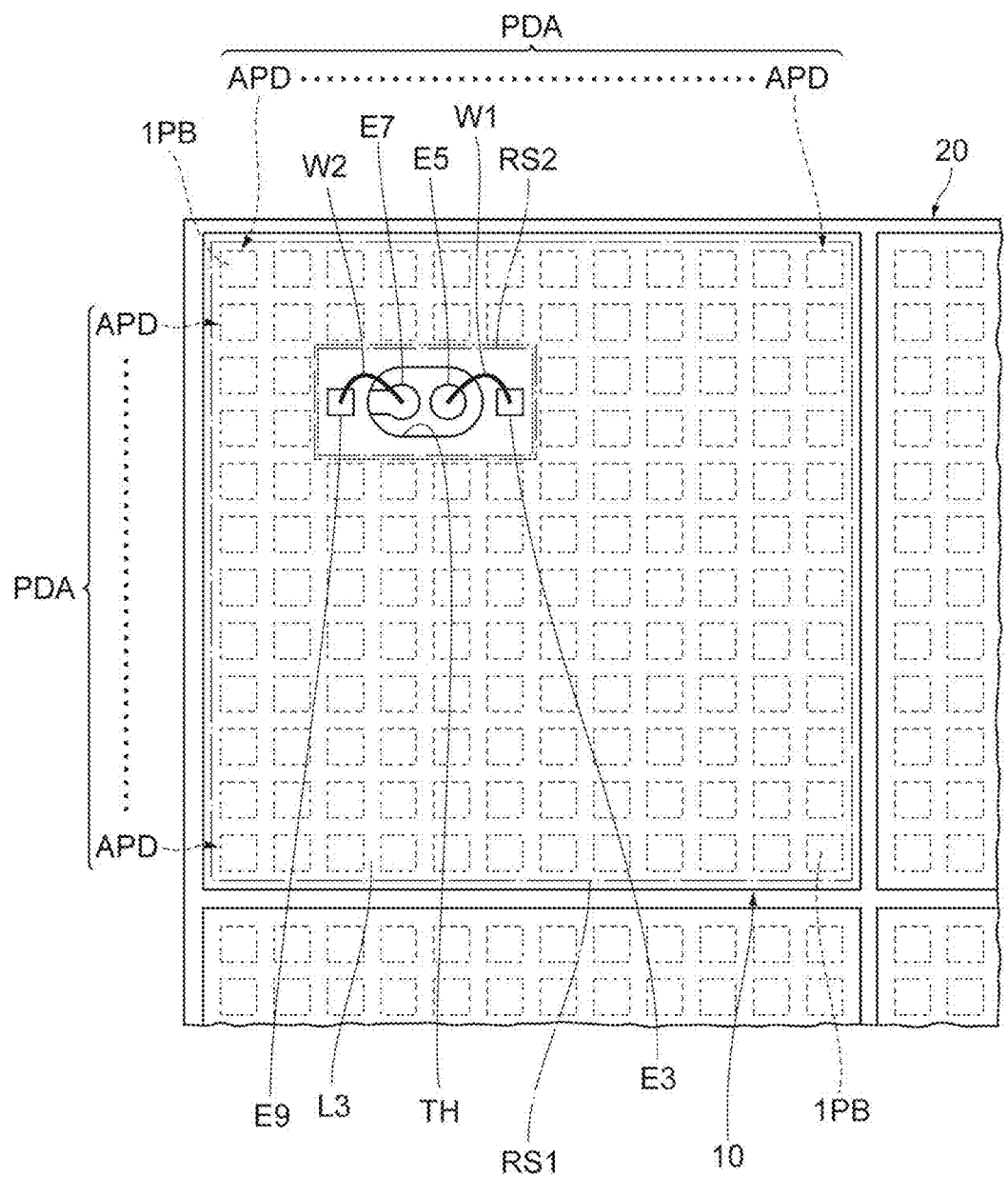
FIG. 16 is a schematic plan view of the semiconductor photodetecting element.

Next, a configuration of the photodetecting device 1 according to a modified example of the present embodiment will be described with reference to FIGS. 15 and 16. FIG. 15 is a diagram for describing a cross-sectional configuration of the photodetecting device according to the present modified example. FIG. 16 is a schematic plan view of the semiconductor photodetecting element. In the present modified example, a position of the second region RS2, that is, a position where the through-hole TH is formed is different from that in the modified example illustrated in FIGS. 12 to 14.

In the modified example illustrated in FIGS. 15 and 16, the second region RS2 is located to be deviated from substantially the center of the first region RS1. Even in which case, the second region RS2 is located inside the first region RS1 to be surrounded by the first region RS1 when viewed from the opposite direction.

Even in the present modified example, a difference in wiring distance between pixels is small, as compared with in the above-described photodetecting device to be compared, as with the above-described embodiment. Thus, it is possible to suppress a difference in signal arrival time between the avalanche photodiodes APD (pixels) to be small even in the photodetecting device 1 according to the present modified example.

Figure 17:
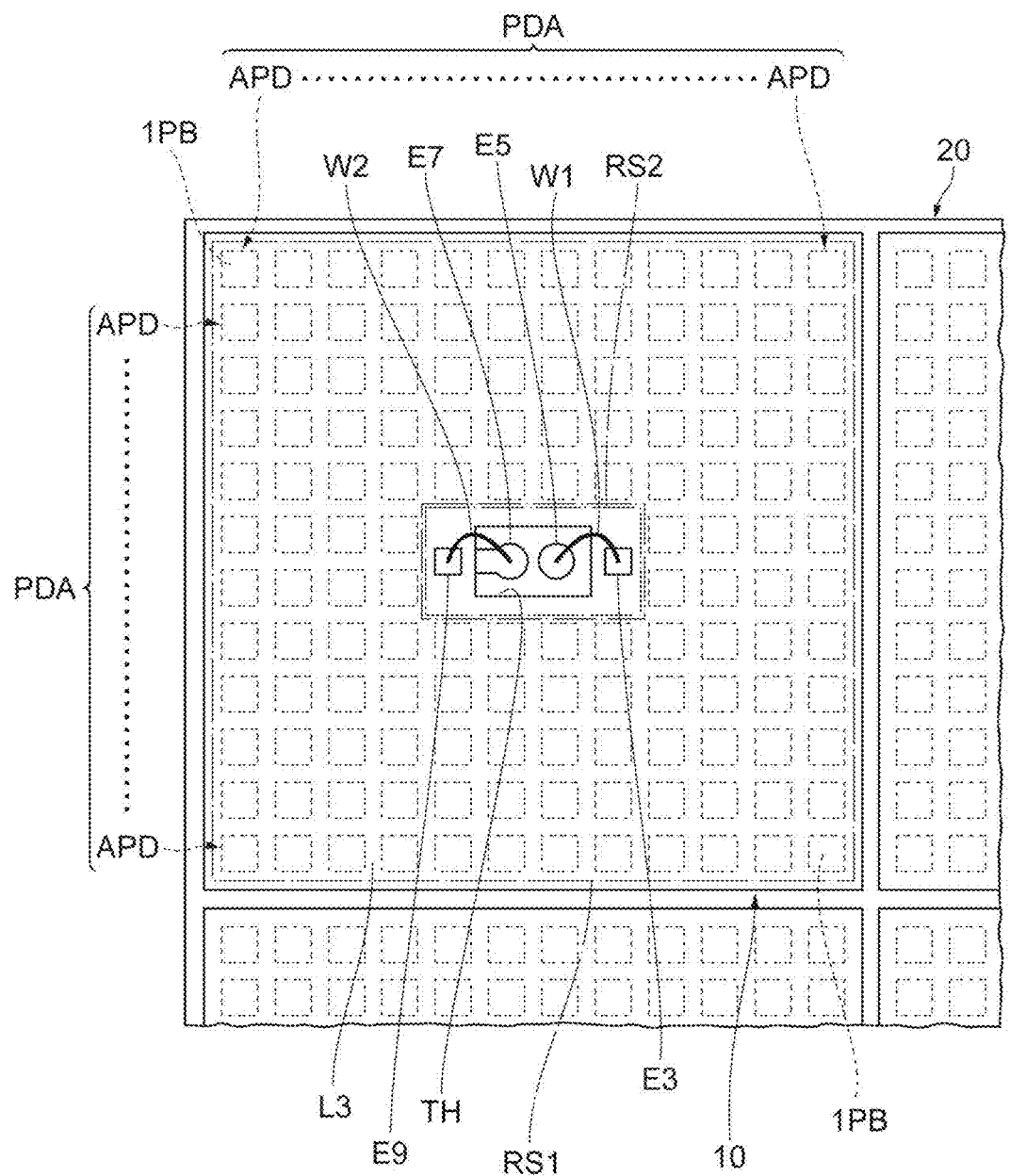
FIG. 17 is a schematic plan view illustrating a modified example of the semiconductor photodetecting element.
Figure 18:
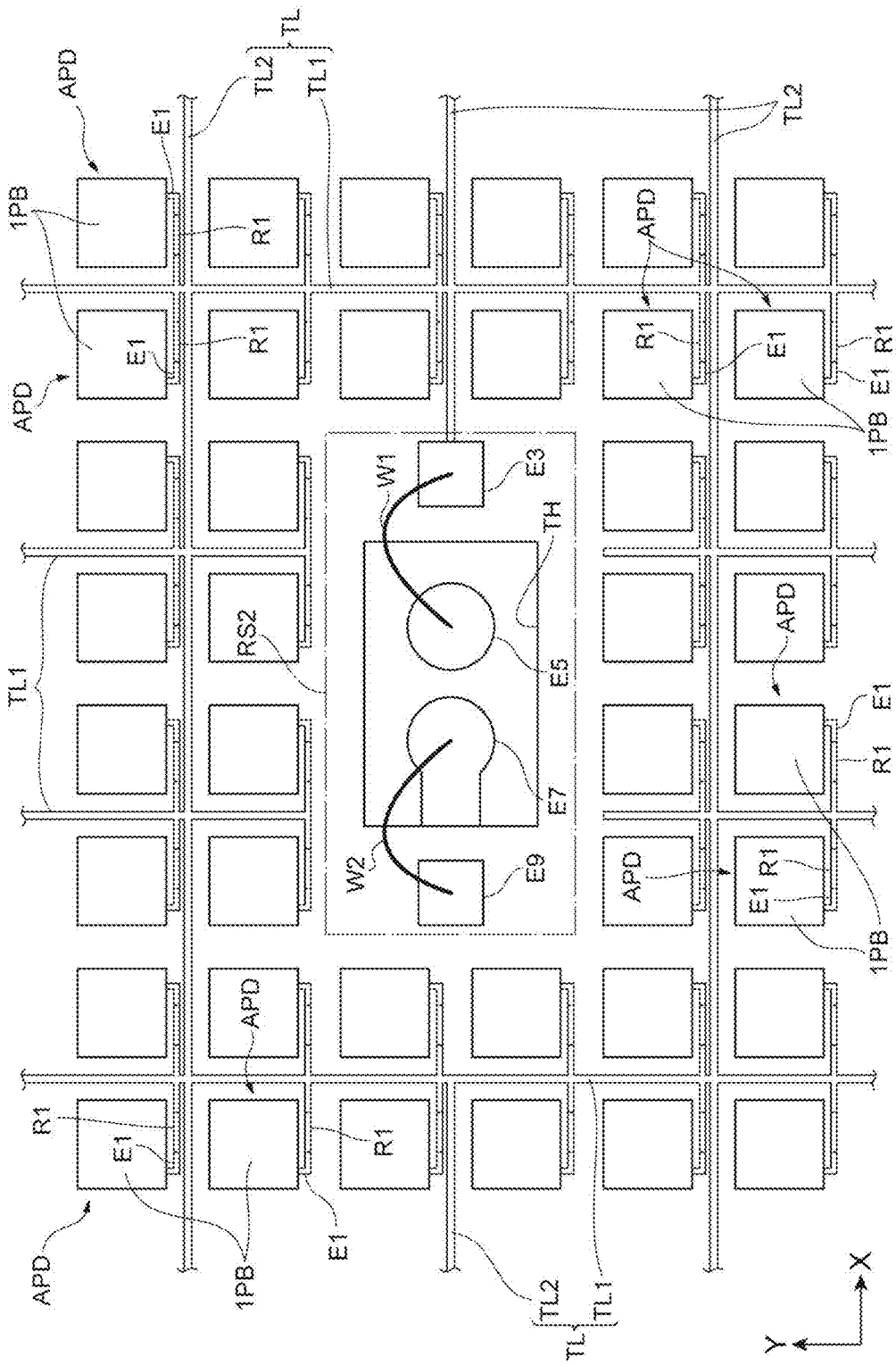
FIG. 18 is a schematic diagram illustrating a configuration of the semiconductor photodetecting element adjacent to a through-hole.
Figure 19:
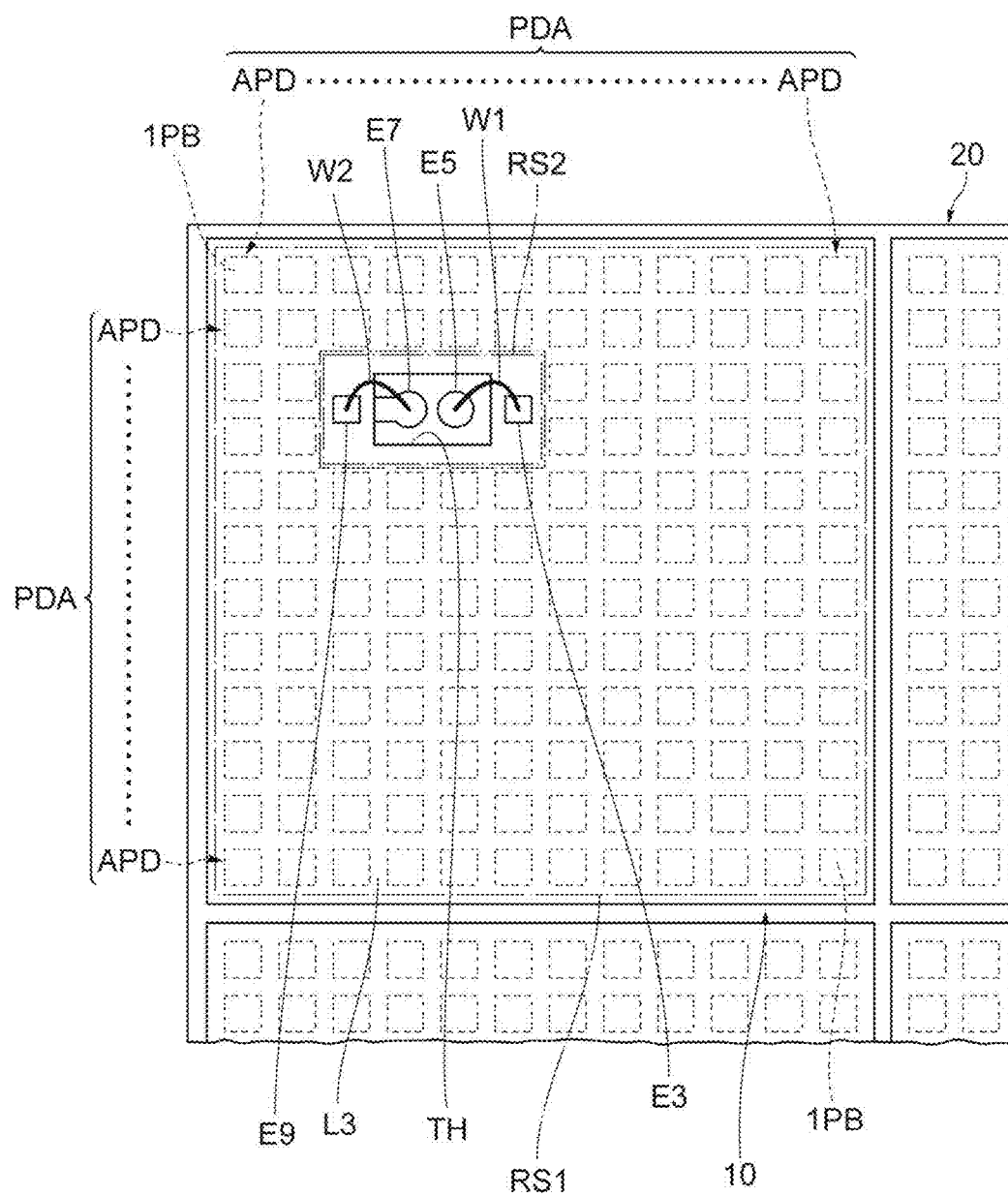
FIG. 19 is a schematic plan view illustrating a modified example of the semiconductor photodetecting element.

Next, a configuration of a modified example of the semiconductor photodetecting element 10 will be described with reference to FIGS. 17 to 19. FIGS. 17 and 19 are schematic plan views illustrating the modified example of the semiconductor photodetecting element. FIG. 18 is a schematic diagram illustrating the configuration of the semiconductor photodetecting element in the vicinity of a through-hole. In the present modified example, a shape of an opening of the through-hole TH is different from that in the modified example illustrated in FIGS. 12 to 16.

In the modified example illustrated in FIGS. 17 to 19, the opening of the through-hole TH has a rectangular shape. A part of the electrode E7 and the electrode E5 exposed inside the through-hole TH are disposed side by side along a long side direction in the opening shape of the through-hole TH. The electrode E9 and the electrode E3 are located to sandwich the through-hole TH in the long side direction in the opening shape of the through-hole TH when viewed from the opposite direction. Distances from an edge of the through-hole TH to the avalanche photodiodes APD (respective pixels) located around the through-hole TH are equal in the present modified example, and thus, it is possible to suppress occurrence of a characteristic variation among the avalanche photodiodes APD.

Figure 20:
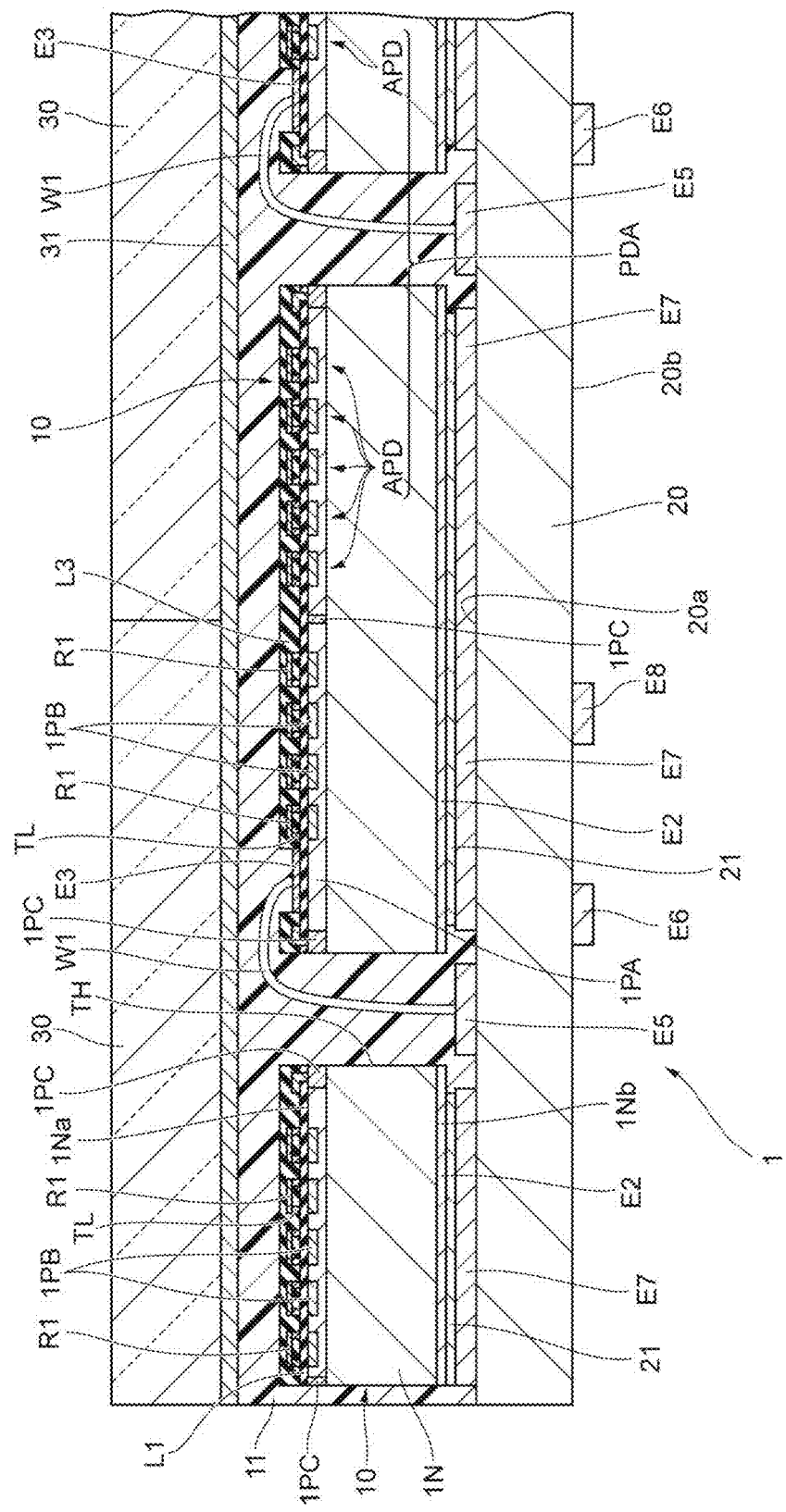
FIG. 20 is a diagram for describing a cross-sectional configuration of a photodetecting device according to a modified example of the present embodiment.
Figure 21:
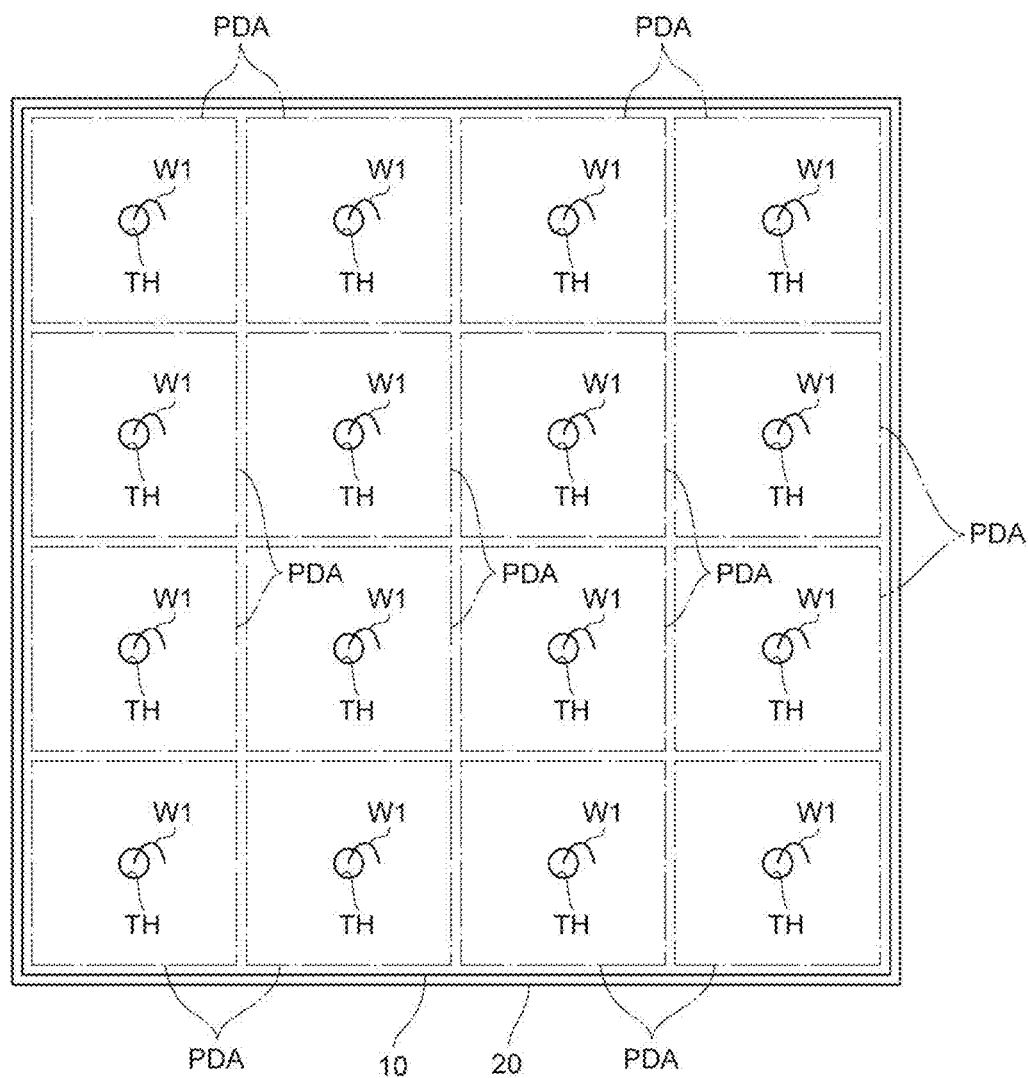
FIG. 21 is a diagram for describing arrangement of a semiconductor photodetecting element.
Figure 22:
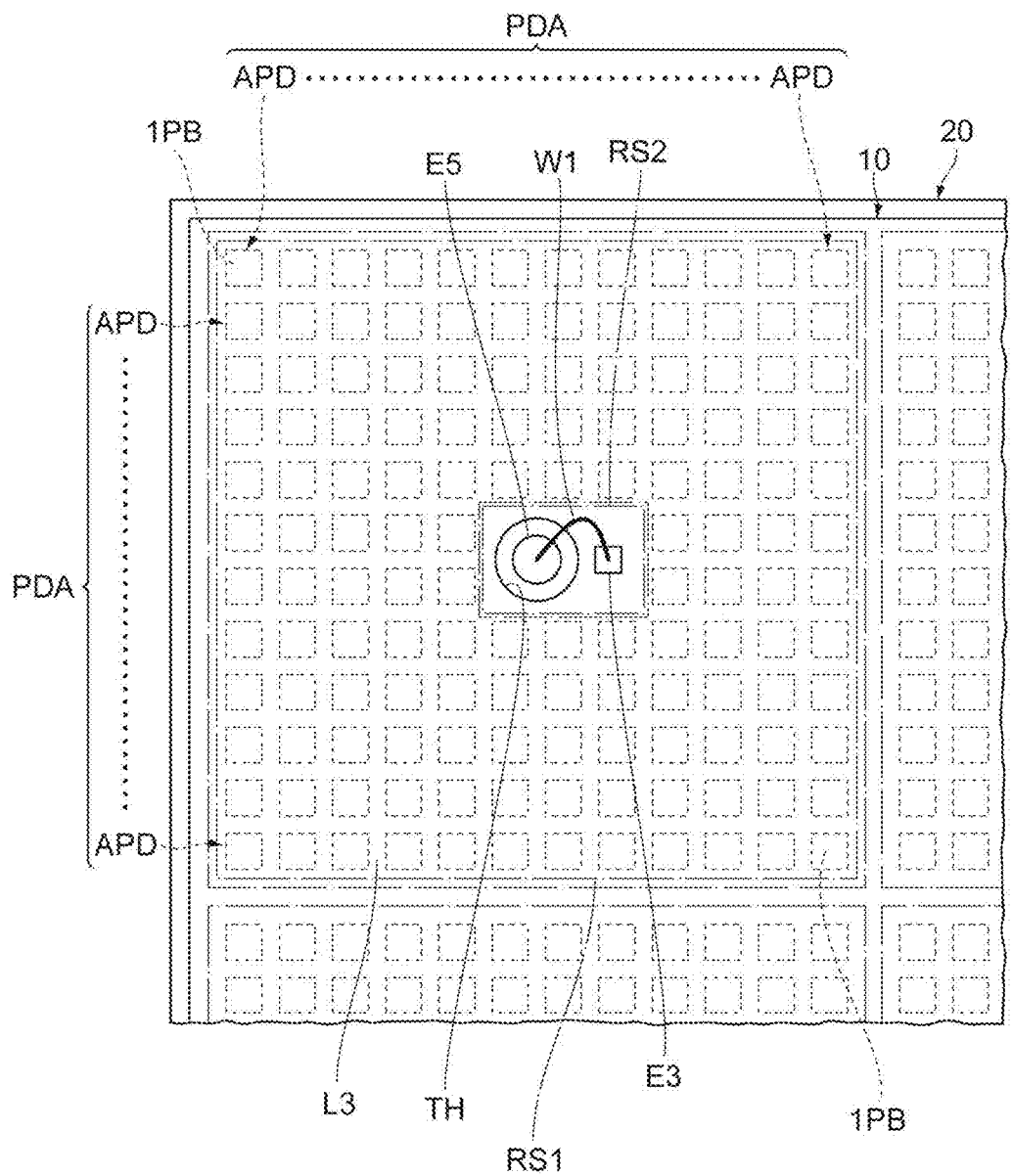
FIG. 22 is a schematic plan view of the semiconductor photodetecting element.

Next, a configuration of the photodetecting device 1 according to a modified example of the present embodiment will be described with reference to FIGS. 20 to 22. FIG. 20 is a diagram for describing a cross-sectional configuration of the photodetecting device according to the modified example of the present embodiment. FIG. 21 is a diagram for describing arrangement of a semiconductor photodetecting element. FIG. 22 is a schematic plan view of the semiconductor photodetecting element.

As also illustrated in FIGS. 20 and 21, the semiconductor photodetecting element 10 includes a plurality of channels, that is, the plurality of photodiode arrays PDA, and the single channel is constituted by the single photodiode array PDA. That is, the plurality of photodiode arrays PDA are formed in the semiconductor substrate 1N. The electrode E3 and the electrode E5 are connected to each other via the bonding wire W1 for each of the channels (photodiode arrays PDA). In the present modified example, the semiconductor substrate 1N includes the semiconductor region 1PC located between the channels.

Since the semiconductor photodetecting element 10 includes the plurality of channels in the modified example illustrated in FIGS. 20 to 22, it is possible to obtain an increase in area of a light receiving region of the semiconductor photodetecting element 10 (photodetecting device 1). In each of the channels (photodiode arrays PDA), a difference in signal arrival time between the avalanche photodiodes APD (pixels) is suppressed to be small, as with the above-described embodiment.

Figure 23:
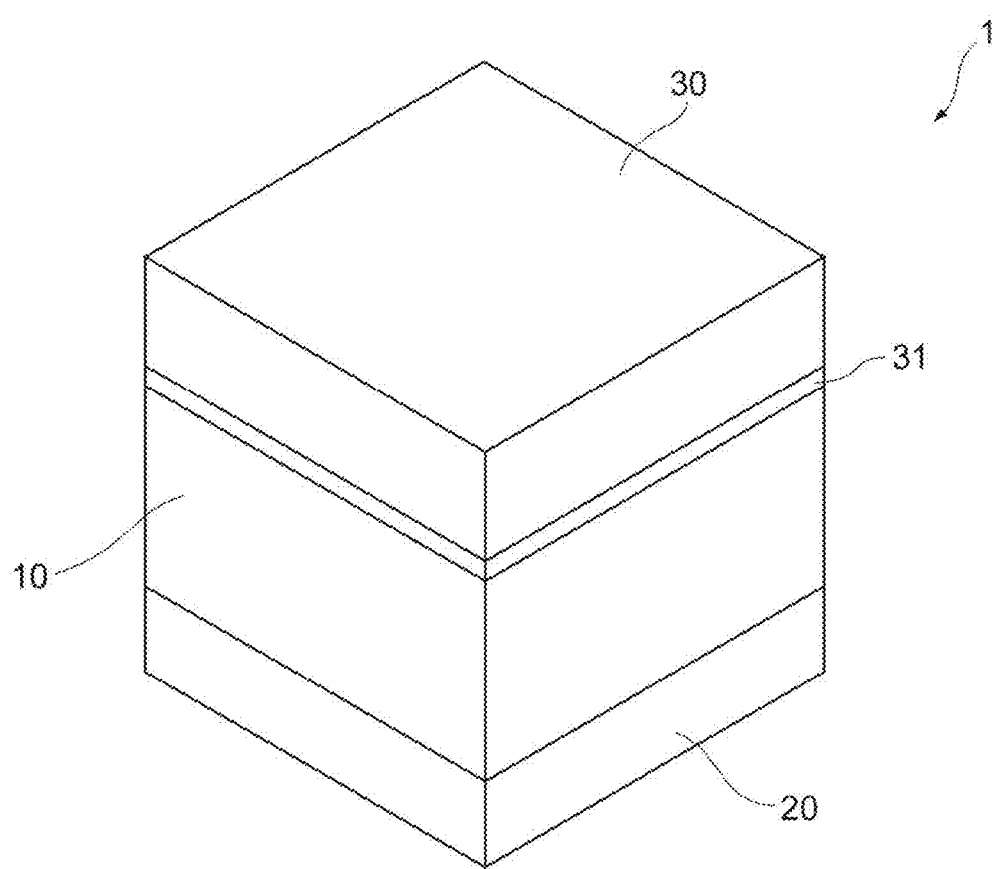
FIG. 23 is a schematic perspective view illustrating a photodetecting device according to a modified example of the present embodiment.
Figure 24:
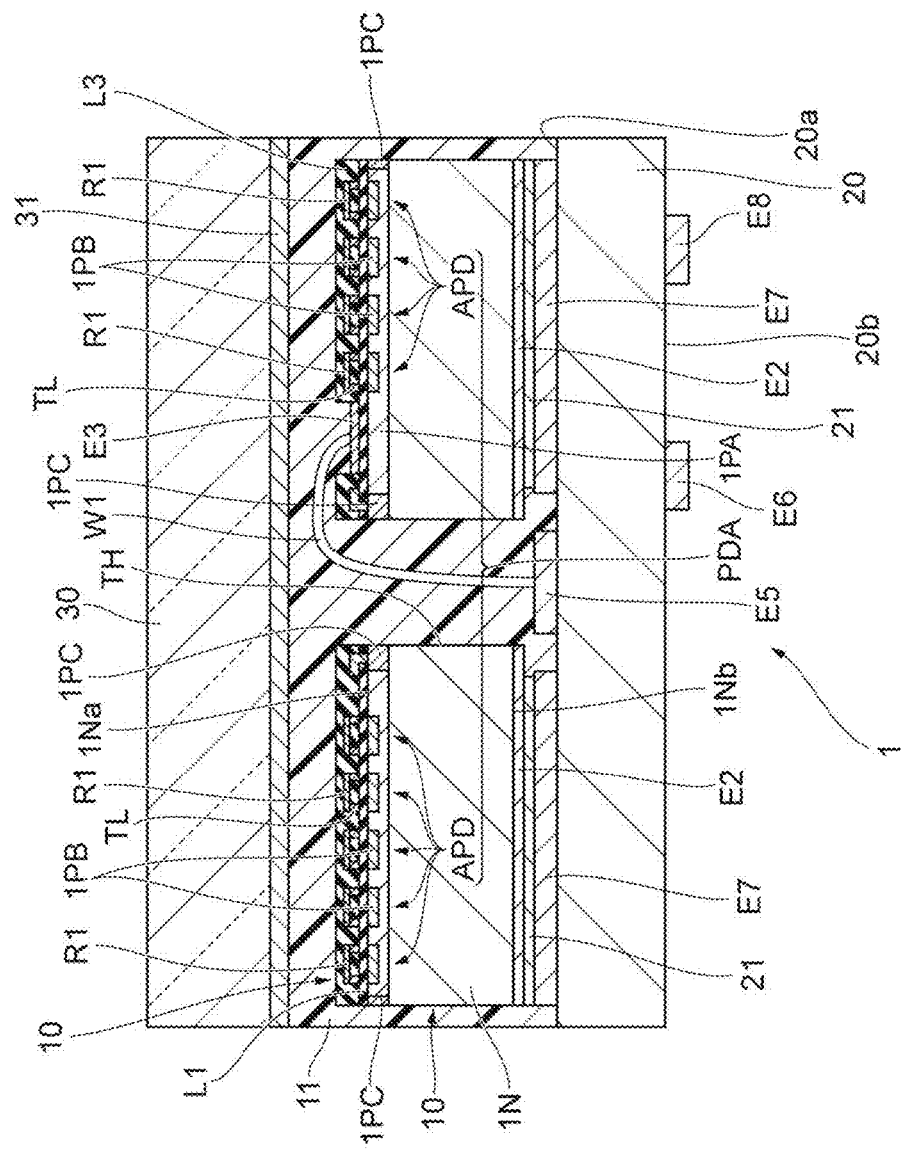
FIG. 24 is a diagram for describing the cross-sectional configuration of the photodetecting device according to the present embodiment.

Next, a configuration of the photodetecting device 1 according to a modified example of the present embodiment will be described with reference to FIGS. 23 and 24. FIG. 23 is a schematic perspective view illustrating the photodetecting device according to the modified example of the present embodiment. FIG. 24 is a diagram for describing a cross-sectional configuration of the photodetecting device according to the present embodiment.

In the modified example illustrated in FIGS. 23 and 24, the photodetecting device 1 includes the single semiconductor photodetecting element 10, the single mount substrate 20, and the single scintillator 30. Even in the present modified example, a difference in signal arrival time between the avalanche photodiodes APD (pixels) is suppressed to be small, as with the above-described embodiment.

Although the embodiment of the present invention has been described as above, the present invention is not necessarily limited to the above-described embodiment, and various modifications can be made in a range without departing from a gist thereof.

When the photodetecting device 1 includes the plurality of semiconductor photodetecting elements 10, it is unnecessary for positions of the second regions RS2 (through-holes TH) and opening shapes of the through-holes TH to be the same in all the semiconductor photodetecting elements 10. The position of the second region RS2 (through-hole TH) may be different for each of the semiconductor photodetecting elements 10. The opening shape of the through-hole TH may be different for each of the semiconductor photodetecting elements 10.

The shapes of the first and second semiconductor regions 1PB and 1PB are not limited to the above-described shapes, and may have another shape (for example, a circular shape). The number (the number of rows and the number of columns) and the arrangement of the avalanche photodiodes APD (the second semiconductor regions 1PB) are not limited to the illustrated number and arrangement. The number and arrangement of the photodiode arrays PDA (channels) are not limited to the illustrated number and arrangement.

INDUSTRIAL APPLICABILITY

The present invention can be applied to a photodetecting device to detect weak light.

REFERENCE SIGNS LIST 1 photodetecting device
1N semiconductor substrate
1Na, 1Nb principal surface of semiconductor substrate
1PA first semiconductor region
1PB second semiconductor region
10 semiconductor photodetecting element
20 mount substrate
20a, 20b principal surface of mount substrate
APD avalanche photodiode
E1 to E3, E5 to E9 electrode
PDA photodiode array
R1 quenching resistor
RS1 first region
RS2 second region
TH through-hole
TL signal line
W1, W2 bonding wire

The invention claimed is:

1. A photodetecting device comprising:
a semiconductor photodetecting element including a semiconductor substrate in which a photodiode array including a plurality of pixels is formed, the semiconductor substrate having a first principal surface and a second principal surface opposing each other; and
a mount substrate disposed to oppose the semiconductor photodetecting element, and having a third principal surface opposing the second principal surface of the semiconductor substrate and a fourth principal surface opposing the third principal surface,
wherein the semiconductor substrate includes a first region in which the plurality of pixels are disposed and a second region located inside the first region to be surrounded by the first region when viewed from a direction in which the first principal surface and the second principal surface oppose each other, a through hole penetrating through the semiconductor substrate is formed in the second region of the semiconductor substrate, a first electrode disposed on a side of the first principal surface of the semiconductor substrate and electrically connected to the plurality of pixels and a second electrode disposed on a side of the third principal surface of the mount substrate are connected to each other via a first wire inserted through the through-hole, and an electrode disposed on a side of the second principal surface of the semiconductor substrate and electrically connected to the semiconductor substrate and an electrode disposed on the third principal surface of the mount substrate are in surface contact with a conductive material to thermally connect the second principal surface and the third principal surface.

2. The photodetecting device according to claim 1, wherein
the semiconductor photodetecting element includes a plurality of semiconductor photodetecting elements,
each of the semiconductor photodetecting elements is disposed on the mount substrate in such a manner that the second principal surface and the third principal surface oppose each other, and
the first electrode and the second electrode are connected to each other via the first wire for each of the semiconductor photodetecting elements.

3. The photodetecting device according to claim 1, wherein
the semiconductor photodetecting element includes a plurality of channels, the single channel being constituted by the single photodiode array, and
the first electrode and the second electrode are connected to each other via the first wire for each of the channels.

4. The photodetecting device according to claim 1, wherein a third electrode disposed on the side of first principal surface of the semiconductor substrate and electrically connected to the semiconductor substrate and a fourth electrode disposed on the side of third principal surface of the mount substrate are connected to each other via a second wire inserted through the through-hole.

5. The photodetecting device according to claim 1, wherein
the second region is located substantially at a center of the first region when viewed from the direction in which, the first principal surface and the second principal surface oppose each other.

6. The photodetecting device according to claim 1, wherein
an opening of the through-hole has a circular shape.

7. The photodetecting device according to claim 1, wherein
an opening of the through-hole has a rectangular shape.

8. The photodetecting device according to claim 1, wherein
the photodiode array includes:
a plurality of avalanche photodiodes operating in a Geiger mode and formed in the semiconductor substrate;
quenching resistors connected in series to the respective avalanche photodiodes and disposed on the side of first principal surface of the semiconductor substrate; and
a signal line to which the quenching resistors are connected in parallel, and that disposed on the side of first principal surface of the semiconductor substrate, and
the signal line is connected to the first electrode.

9. The photodetecting device according to claim 1, wherein
the entire second electrode is exposed inside the through hole when viewed from the direction in which the first principal surface and the second principal surface oppose each other.

10. The photodetecting device according to claim 1, wherein
the semiconductor photodetecting element is molded with resin and the through-hole is filled with the resin.

* * * * *